(12) United States Patent
Regnier

(10) Patent No.: US 9,462,676 B2
(45) Date of Patent: Oct. 4, 2016

(54) MULTI-LAYER CIRCUIT MEMBER WITH REFERENCE CIRCUIT

(75) Inventor: Kent E. Regnier, Lombard, IL (US)

(73) Assignee: Molex, LLC, Lisle, IL (US)

( * ) Notice: Subject to any disclaimer, the term of this patent is extended or adjusted under 35 U.S.C. 154(b) by 699 days.

(21) Appl. No.: 13/508,401

(22) PCT Filed: Nov. 4, 2010

(86) PCT No.: PCT/US2010/055439
§ 371 (c)(1),
(2), (4) Date: Jul. 25, 2012

(87) PCT Pub. No.: WO2011/056967
PCT Pub. Date: May 12, 2011

(65) Prior Publication Data
US 2012/0280766 A1 Nov. 8, 2012

Related U.S. Application Data

(60) Provisional application No. 61/258,976, filed on Nov. 6, 2009.

(51) Int. Cl.
*H03H 7/09* (2006.01)
*H05K 1/02* (2006.01)
(Continued)

(52) U.S. Cl.
CPC ........ *H05K 1/0227* (2013.01); *H01R 13/6469* (2013.01); *H03H 7/09* (2013.01); *H05K 1/0245* (2013.01); *H05K 1/0248* (2013.01); *H01R 13/6633* (2013.01); *H01R 2107/00* (2013.01); *H05K 1/0233* (2013.01); *H05K 3/3447* (2013.01); *H05K 3/429* (2013.01); *H05K 2201/09263* (2013.01); *H05K 2201/09309* (2013.01); *H05K 2201/09336* (2013.01); *H05K 2201/09663* (2013.01); *H05K 2201/1006* (2013.01); *H05K 2201/10189* (2013.01); *H05K 2201/10371* (2013.01); *H05K 2203/0307* (2013.01)

(58) Field of Classification Search
CPC .. H03H 2001/0085; H03H 7/09; H05K 1/11; H05K 1/0227
USPC ................................ 333/5, 185, 4; 174/262; 439/620.01–620.34
See application file for complete search history.

(56) References Cited

U.S. PATENT DOCUMENTS 5,719,750 A  2/1998  Iwane
6,388,208 B1  5/2002  Kiani et al.
(Continued)

FOREIGN PATENT DOCUMENTS

JP  2000-244134 A  9/2000
JP  2001-185821 A  7/2001
(Continued)

OTHER PUBLICATIONS

International Search Report for PCT/US2010/055439.

*Primary Examiner* — Robert Pascal
*Assistant Examiner* — Rakesh Patel
(74) *Attorney, Agent, or Firm* — Stephen L. Sheldon

(57) ABSTRACT

A multi-layer circuit member includes first and second electrically connected reference regions. At least a portion of a signal conductor is in proximity to the first region and a circuit component is in proximity to the second region. An area of increased impedance exists between the first and second electrically connected regions.

16 Claims, 22 Drawing Sheets

(51) Int. Cl.
*H01R 13/6469* (2011.01)
*H01R 13/66* (2006.01)
*H01R 107/00* (2006.01)
*H05K 3/34* (2006.01)
*H05K 3/42* (2006.01)

(56) References Cited

U.S. PATENT DOCUMENTS

| | | | |
|---|---|---|---|
| 7,674,136 B2 | 3/2010 | Steinke et al. | |
| 7,940,144 B2 * | 5/2011 | Koch et al. | 333/33 |
| 2006/0139117 A1 * | 6/2006 | Brunker et al. | 333/1 |
| 2006/0232301 A1 | 10/2006 | Morlion et al. | |

FOREIGN PATENT DOCUMENTS

| | | |
|---|---|---|
| JP | 2001-267701 A | 9/2001 |
| JP | 2004-260737 A | 9/2004 |
| JP | 2004-274005 A | 9/2004 |
| JP | 2005-340506 A | 12/2005 |
| JP | 2009-026776 A | 2/2009 |
| KR | 2005-0042468 A | 5/2005 |
| WO | WO 2008/021217 A1 | 2/2008 |

* cited by examiner

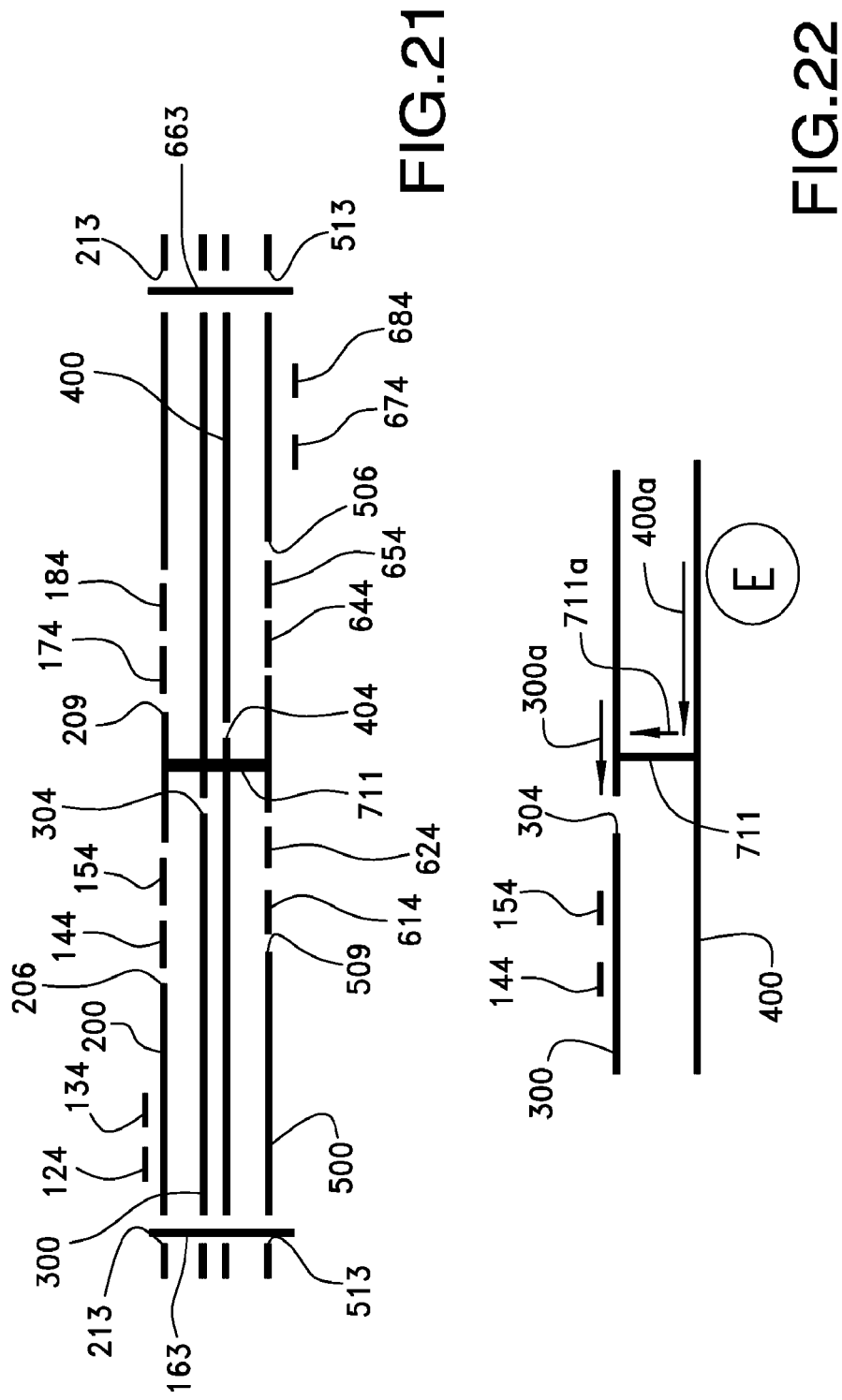

ial Patent Application No. 61/258,976, filed Nov. 6,
MULTI-LAYER CIRCUIT MEMBER WITH REFERENCE CIRCUIT

CROSS-REFERENCE TO RELATED APPLICATIONS

This patent application claims the benefit of U.S. Provisional Patent Application No. 61/258,976, filed Nov. 6, 2009, which is incorporated herein by reference in its entirety.

BACKGROUND

The disclosure relates generally to a multi-layer circuit member and, more particularly, to a multi-layer circuit member having an improved reference circuit.

Electronic devices commonly use multi-layer circuit boards or members for transmitting and receiving high speed as well as high data rate signals. With the desire for higher speed electronics in the same or smaller footprints, an ongoing challenge exists to increase the density of the multi-layer circuit boards. Some multi-layer circuit boards include multiple reference or ground planes embedded within the circuit board together with various signal conductors for transmitting the desired information or data along or through the circuit board. While such reference planes act as an electrical shield, they also typically act as a portion of the return path for the various signal conductors of the circuit board. Energy or noise transferred to a first reference plane from another source such as another signal conductor or another reference plane acting as a return path for another signal conductor may affect signals conducted by signal conductors coupled to the first reference plane.

Stacked modular jacks may use a single multi-layer circuit board to pass signals from a primary circuit board to the pair of aligned ports. Energy associated with one port may sometimes be undesirably transferred to the circuitry of the other port which may cause errors in the system and otherwise render the system less reliable or inoperative. It is therefore desirable to minimize the impact that any energy source has on a set of signal conductors even though the signal conductors are separated from the energy source by one or more reference planes.

SUMMARY

A multi-layer circuit member includes first and second spaced apart, generally parallel reference planes and may include an electrically conductive via extending between the reference planes to provide an electrical connection. A first portion of a first signal conductor is adjacent a first region of the first reference plane and at least one circuit component is adjacent to and operative to transfer energy to the second reference plane. An elongated area of increased impedance is located within the first reference plane between the first region of the first reference plane and the via.

A multi-layer circuit member may include a conductive reference plane including first and second electrically connected regions and a at least a portion of a first signal conductor being adjacent the first region of the reference plane. At least one second signal conductor may include a portion extending through an opening in the reference plane adjacent the second region of the reference plane. An area of increased impedance is located between the first and second electrically connected regions of the first reference plane.

A filtering module may include a dielectric housing, a magnetics assembly mounted on the housing and a multi-layer circuit member. The magnetics assembly may include at least one transformer interconnected to a plurality of conductors. The multi-layer circuit member may include first and second electrically connected reference regions. At least a portion of a signal conductor may be in proximity to the first region and a circuit component may be in proximity to the second region. An area of reduced electrical conductivity is located between the first and second electrically connected regions.

BRIEF DESCRIPTION OF THE DRAWINGS

Various other objects, features and attendant advantages will become more fully appreciated as the same becomes better understood when considered in conjunction with the accompanying drawings in which like reference characters designate the same or similar parts throughout the several views, and in which:

FIG. 21 is a generally schematic cross-sectional view of the circuit board of FIG. 5;

FIG. 22 is a generally schematic cross-sectional view illustrating one aspect of the circuit board of FIG. 5.

DETAILED DESCRIPTION OF THE ILLUSTRATED EMBODIMENTS

The following description is intended to convey the operation of exemplary embodiments of the invention to those skilled in the art. It will be appreciated that this description is intended to aid the reader, not to limit the invention. As such, references to a feature or aspect are intended to describe a feature or aspect of an embodiment of the invention, not to imply that every embodiment of the invention must have the described characteristic. Furthermore, it should be noted that the depicted detailed description illustrates a number of features. While certain features have been combined together to illustrate potential system designs, those features may also be used in other combinations not expressly disclosed. Thus, the depicted combinations are not intended to be limiting unless otherwise noted.

It is generally desirable to increase the electrically separation or isolation between the various ports of a magnetic jack. Increasing the isolation of the vertically aligned ports of a magnetic jack may be especially problematic when the magnetics and circuitry for the aligned jacks are contained in a single module that is inserted into the jack housing. While shielding can be provided between signal layers of a common circuit board, signals traveling through one set of signal conductors (e.g., those associated with one of the vertically aligned ports) may still negatively impact signals traveling through another set of signal conductors within the same circuit board (e.g. those connected to the other vertically aligned port). In instances in which multiple reference or ground layers or planes are provided, such reference layers are often electrically inter-connected by one or more conductive vias in order to create a junction and maintain a common reference potential. However, it should be noted that the reference planes not only act as shields but also may act as a return path for the associated signal conductors. Therefore, energy transmitted from one reference plane to another (typically through the vias) will tend to decrease the electrical isolation between the vertically aligned ports of the magnetic jack.

Figure 1:
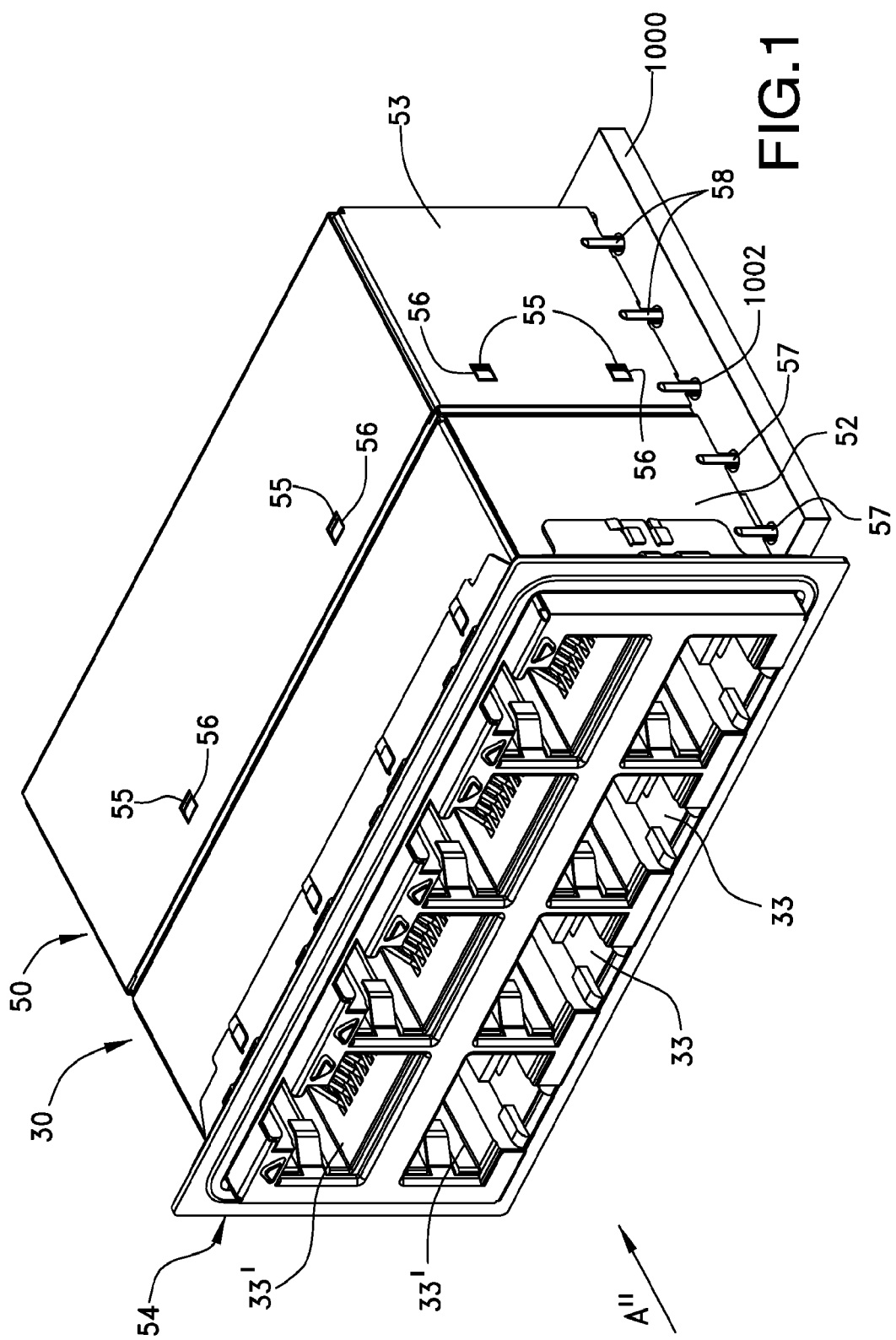
FIG. 1 is a front perspective view of a magnetic jack in accordance with a first embodiment.
Figure 2:
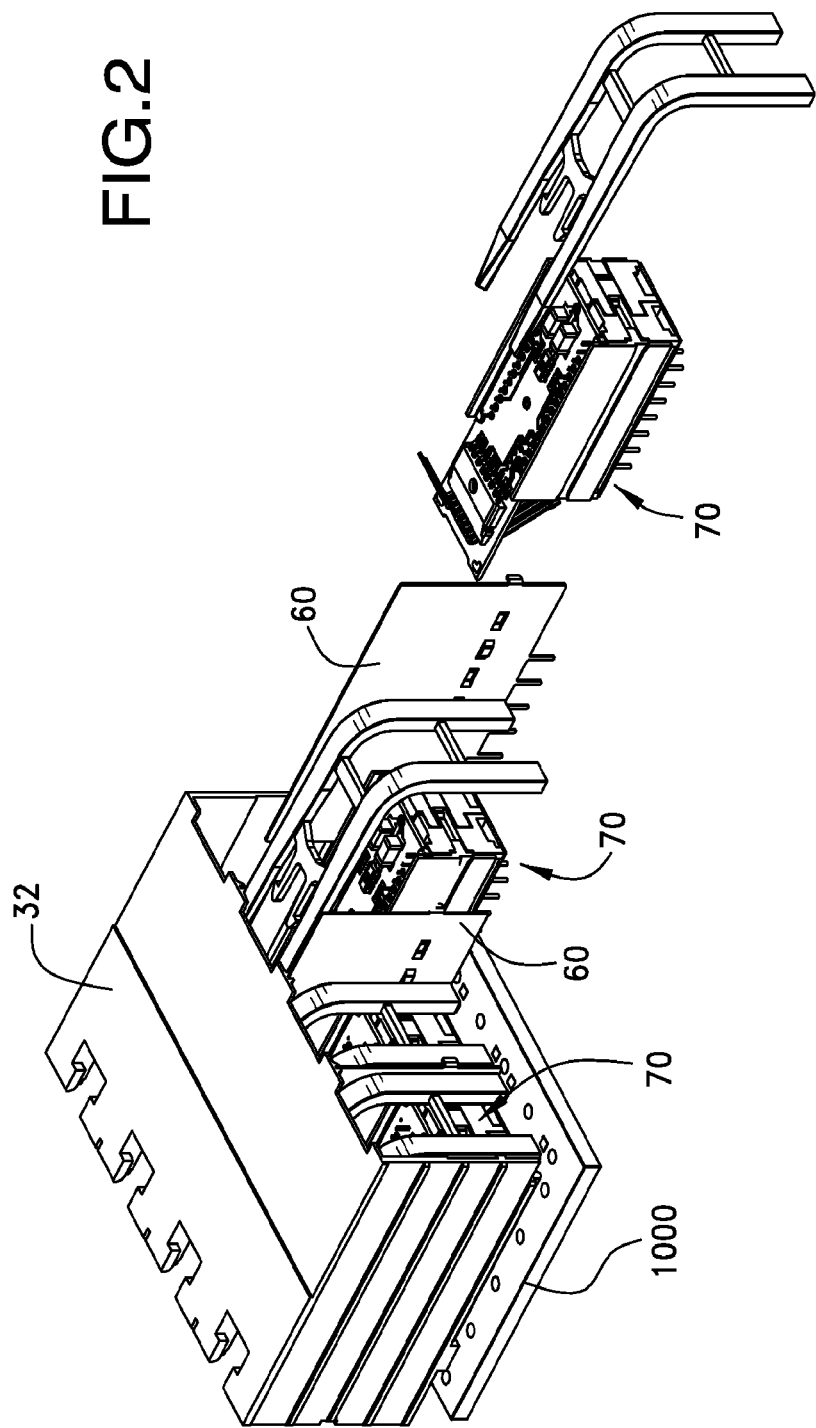
FIG. 2 is a partially exploded rear perspective view of the magnetic jack housing of FIG. 1 with the internal modules in various stages of insertion therein.
Figure 5:
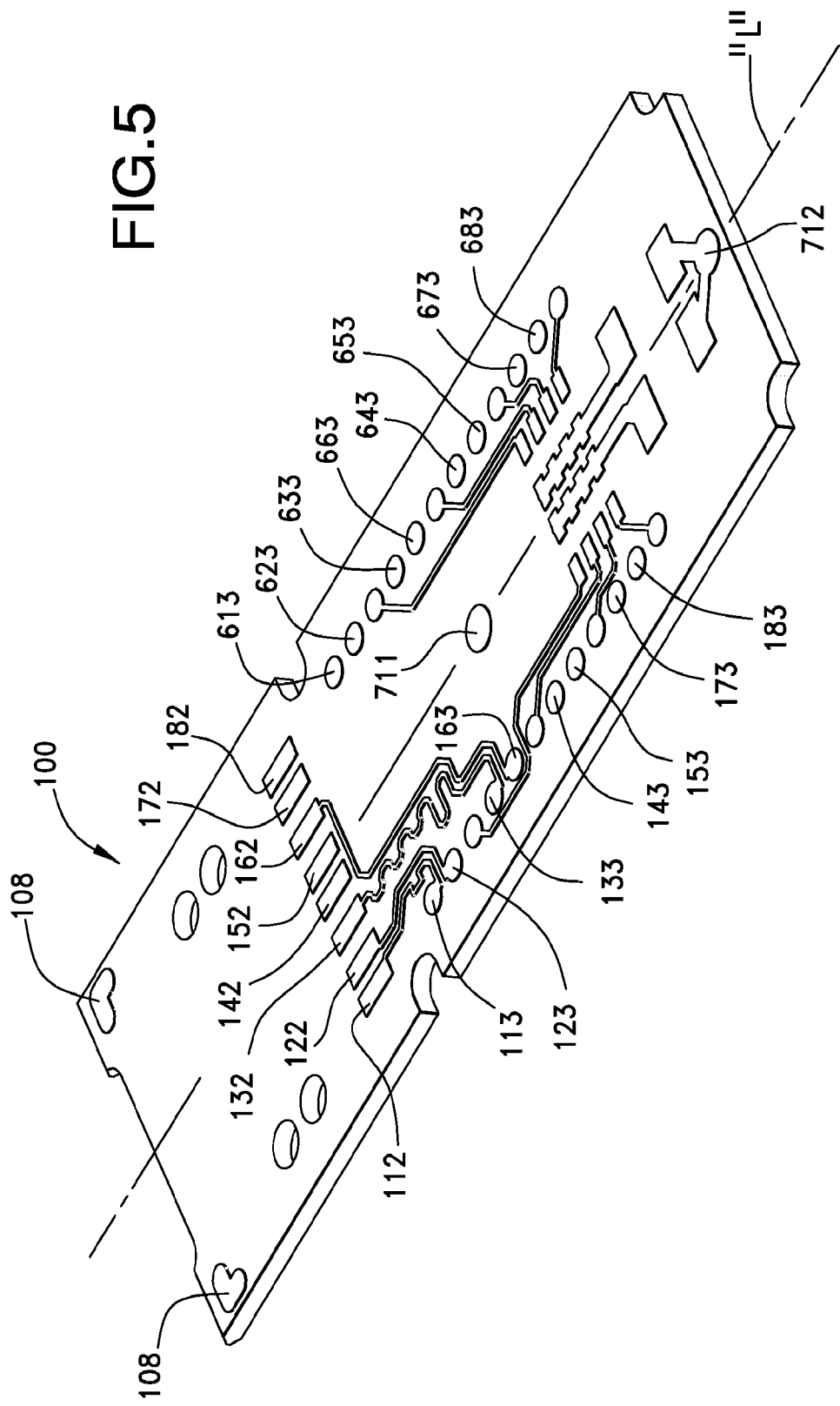
FIG. 5 is a perspective view of a circuit board used with the internal module of FIG. 3.

Referring to FIG. 1,and FIG. 2, the front side of a multiple input, magnetic, stacked jack 30 is illustrated with a housing 32 made of an insulating material such as a synthetic resin (for example, PBT) and including front side openings or ports 33 arranged in vertically aligned pairs 33' with each port configured to receive an Ethernet or RJ-45 type jack (not shown). Each port 33 has eight terminals and, according to the Ethernet standard, the terminals are coupled as differential pairs with the first and second terminals forming a first pair, the third and sixth terminals forming another pair, the fourth and fifth terminals forming still another pair and the seventh and eighth terminals forming the final pair. Accordingly, referring to FIG. 5, it can been seen that eight circuit board contact pads 112-118 are positioned in a row along the top surface of circuit board 100.

It should be noted that in this description, representations of directions such as up, down, left, right, front, rear, and the like, used for explaining the structure and movement of each part of the disclosed embodiment are not intended to be absolute, but rather are relative. These representations are appropriate when each part of the disclosed embodiment is in the position shown in the figures. If the position or frame of reference of the disclosed embodiment changes, however, these representations are to be changed according to the change in the position or frame of reference of the disclosed embodiment.

Shield assembly 50 fully encloses housing 32 except for openings aligned with ports 33 and the bottom or lower surface of the housing and includes a front shield component 52 and a rear shield component 53. Additional shielding components 54 are positioned adjacent and generally surround ports 33 to complete shield assembly 50. The joinable front and rear shield components are formed with interlocking tabs 55 and openings 56 for engaging and securing the components together when the shield assembly 50 is placed into position around the magnetic jack housing 32. Each of the shield components 52, 53 includes ground pegs 57, 58, respectively, that extend into ground through-holes 1002 in the circuit board 1000 when mounted thereon.

As depicted in FIG. 2, the rear portion of the magnetic jack housing 32 includes a large opening or receptacle 34 with three evenly spaced metal inter-module shields 60 positioned therein to define four subassembly receiving cavities 35. Each cavity 35 is sized and shaped to receive an internal subassembly module 70. While three inter-module shields 60 are depicted, a different number of shields may be used to define a different number of cavities. More specifically, to provide vertical electrical isolation or shielding between each module 70, one shield fewer in number than the desired number of modules is utilized. Shield 60 as depicted is stamped and formed of sheet metal material but could be formed of other conductive materials such as die cast metal or plated plastic material.

Figure 3:
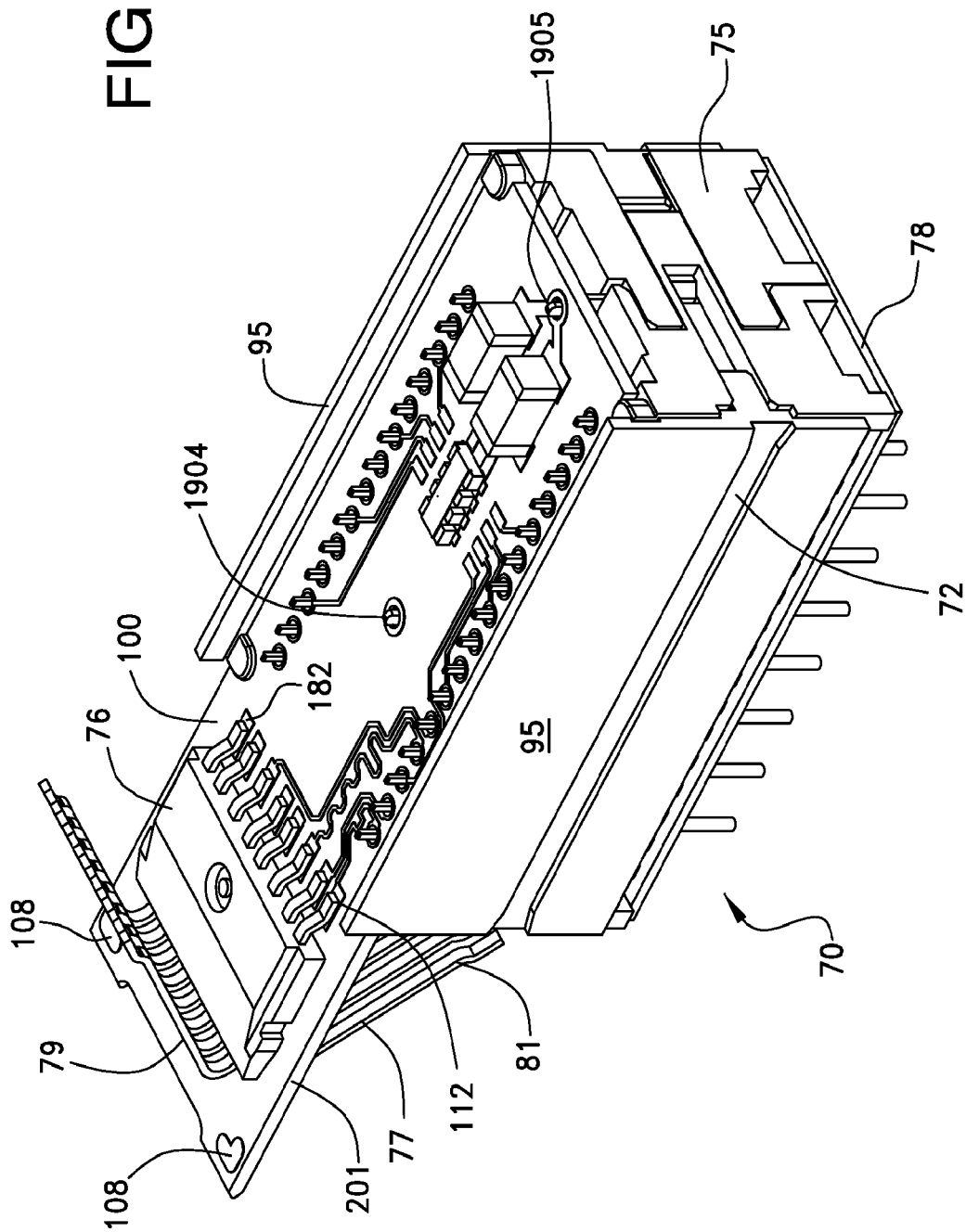
FIG. 3 is a perspective view of one of the internal modules of FIG. 2.
Figure 4:
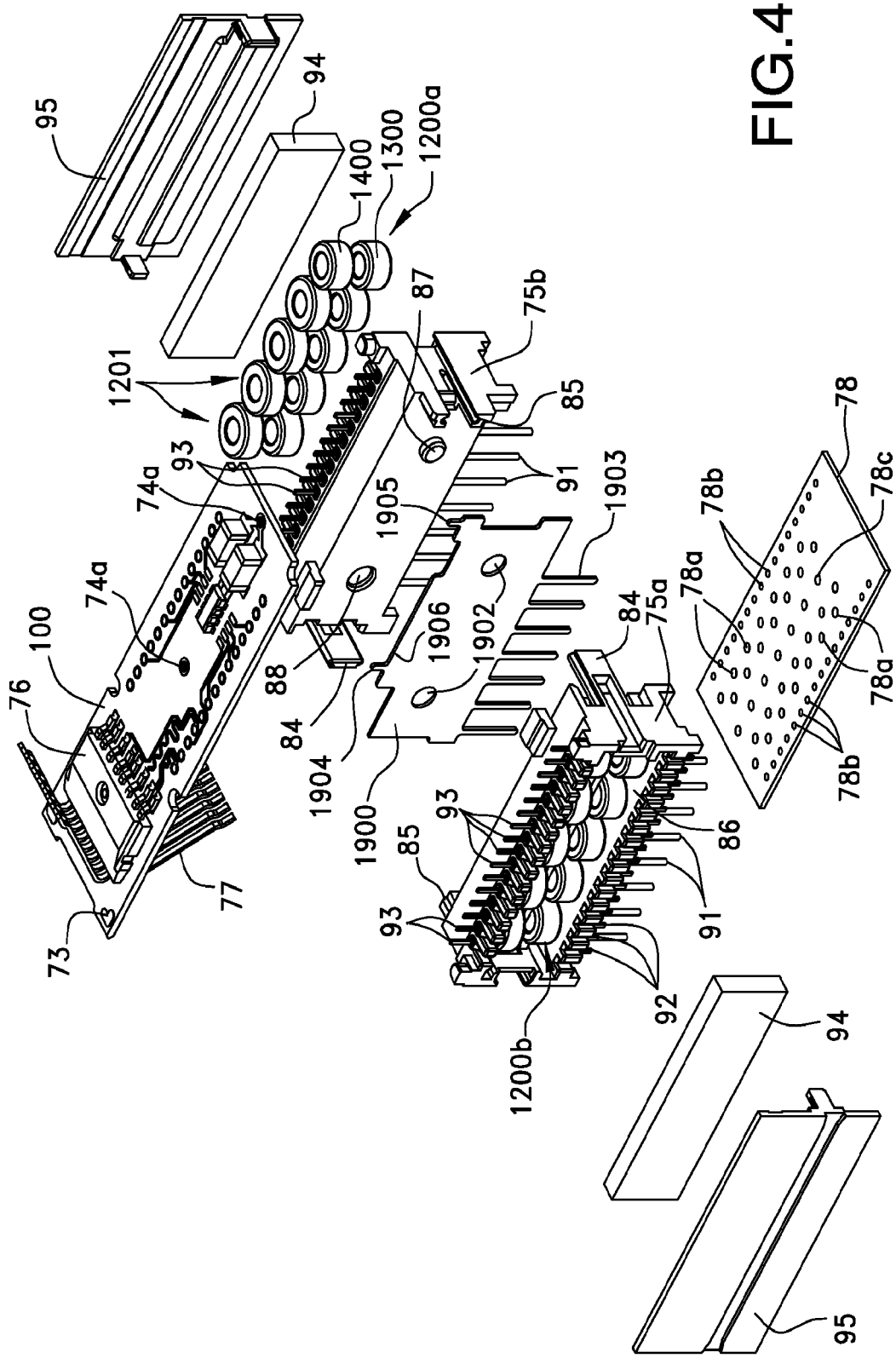
FIG. 4 is an exploded perspective view of the internal module of FIG. 3.

Referring to FIGS. 3 and 4, internal subassembly module 70 includes a component housing 75 with transformer circuitry and filtering components therein. An upper circuit board 100 is mounted generally adjacent an upper surface of component housing 75 and includes upper and lower contact assemblies 76, 77 mechanically and electrically connected thereto. Lower circuit board 78 is mounted generally adjacent a lower surface of component housing 75. The lower and upper circuit boards 78, 100 include resistors, capacitors and other components associated with the transformers and chokes located inside the component housing 75.

Subassembly module 70 includes the upper and lower contact assemblies 76, 77 for providing a stacked jack, or dual jack, functionality. The upper contact assembly 76 is mounted to an upper surface of upper circuit board 100 and provides physical and electrical interfaces, including upwardly extending contact terminals 79, for connecting to an Ethernet plug inserted within port 33 in the upper row of ports. The lower contact assembly 77 is mounted to a lower surface of upper circuit board 100 and includes downwardly extending electrically conductive contact terminals 81 for connection to an Ethernet plug inserted within a port 33 in the lower row of ports. Upper contact assembly 76 is electrically connected to the upper circuit board 100 through leads, which are soldered, or electrically connected by some other means such as welding or conductive adhesive, to a row of circuit board pads 112-182 that are positioned along the top surface of upper circuit board 100 generally adjacent a forward edge of component housing 75. Lower contact assembly 77 is similarly mounted on a lower surface of upper circuit board 100 and is connected to second, similar row of circuit board pads 613-683 on a lower surface of upper circuit board 100.

Referring to FIG. 4, component housing 75 is a two-piece assembly having a left housing half 75a and right housing half 75b, one for holding the magnetics 1200a of the upper port and the other for holding the magnetics 1200b of the lower port of each pair of vertically aligned ports. The left and right housings halves 75a, 75b are formed from a synthetic resin such as LCP or another similar material and may be physically identical for reducing manufacturing costs and simplifying assembly. A latch projection 84 extends from the left sidewall (as viewed in FIG. 4) of each housing half. A latch recess 85 is located in the right sidewall of each housing half and lockingly receives latch projection 84 therein.

Each housing half 75a, 75b is formed with a large box-like receptacle or opening 86 that receives the filtering magnetics 1200 therein. The receptacles 86 of the two housing halves 75a, 75b face in opposite directions and have an internal elongated shield member 1900 positioned between the housing halves to electrically isolate the two receptacles. The surface of each housing half facing the elongated shield member 1900 includes a projection 87 and a similarly sized socket 88 positioned such that when the two housing halves 75a, 75b are assembled together, the projection of each housing half will be inserted into the socket of the other housing half. The elongated shield member 1900 includes a pair of holes 1902 aligned with the projections 87 and sockets 88 such that upon assembling the housing halves 75a, 75b and shield member 1900, each projection 87 will extend through one of the holes 1902 and into its socket 88 in order to secure shield member 1900 in position relative to the housing halves.

A first set of electrically conductive pins or tails 91 extend out of the lower surface of the housing halves 75a, 75b and are inserted through holes 78a in the lower circuit board 78 and soldered thereto. Pins 91 are long enough to extend past lower circuit board 78 and are configured to be subsequently inserted into holes (not shown) in circuit board 1000 and soldered thereto. A second, shorter set of electrically conductive pins 92 also extend out of the lower surface of the housing halves 75a, 75b and extend into and are subsequently soldered to holes 78b in lower circuit board 78. A third set of electrically conductive pins 93 extend out of the upper surface of housing halves 75a, 75b and are inserted into holes 100a in upper circuit board 100 and soldered thereto.

The magnetics 1200 provide impedance matching, signal shaping and conditioning, high voltage isolation and common-mode noise reduction. This is particularly beneficial in Ethernet systems that utilize cables having unshielded twisted pair ("UTP") transmission lines, as these line are more prone to picking up noise than shielded transmission lines. The magnetics help to filter out the noise and provide good signal integrity and electrical isolation. The magnetics include four transformer and choke subassemblies 1201 associated with each port 33. The choke is configured to present high impedance to common-mode noise but low impedance for differential-mode signals. A choke is provided for each transmit and receive channel and each choke can be wired directly to the RJ-45 connector.

Elongated shield member 1900 is a generally rectangular plate and includes seven downwardly depending solder tails 1903 configured for insertion and soldering in holes 78c in lower circuit board 78. Tails 1903 are long enough to extend past lower circuit board 78 and are subsequently inserted into holes (not shown) in circuit board 1000 and soldered thereto. Two upwardly extending solder tails 1904, 1905 extend from a top surface or edge 1906 of shield member 1900 and are configured for insertion and soldering in plated holes or vias 711, 712 in upper circuit board 100. Shield member 1900 is configured to shield the transformers 1300 and chokes 1400 as well as other circuit components of each housing half from those of its adjacent housing half in order to shield the circuitry of the lower port from that of its vertically aligned upper port.

As described above, the magnetics 1200 associated with each port 33 of the connector include four transformer and choke subassemblies 1201 together with wires (not shown) wrapped around the individual transformers and chokes. The transformer and choke assemblies 1201 are inserted into each receptacle 86 and the wires (not shown) are soldered or otherwise connected to pins 92, 93. A shock absorbing, insulative foam insert 94 is inserted into each receptacle 86 over the transformer and choke assemblies 1201 to secure them in place. An insulative cover 95 is secured to each housing half 75a, 75b to enclose receptacle 86 and secure foam insert 94 therein and to provide insulative shielding to pins 93.

As depicted, upper printed circuit board 100 is a multi-layer circuit board with six layers of conductors and a dielectric layer between adjacent conductive layers. Upper circuit board 100 also includes plated through-holes or vias for interconnecting conductors located on one conductive layer to conductors located on another layer through the various dielectric layers. Although the vias are depicted in the various figures as being solid or cylindrical, they are typically tube-like structures formed by creating a hole in the circuit board and then plating the inner surface of the hole. Upper circuit board 100 includes the circuitry for connecting the magnetics within component housing 75 to their respective upper and lower contact assemblies 76, 77.

It is desirable to minimize the impact of the high speed signals associated with one port on the high speed signals passing through the other port. In a system that utilizes a single subassembly module 70 for a pair of aligned ports, electrically isolating the circuitry for each port within the circuit board is desirable. Achieving this result is complicated by the interconnection of the reference planes within the circuit board which causes energy associated with the reference plane acting as a return path for the signal conductors of one port to impact the reference plane associated with the signal conductors of the other port. The transfer of energy between the reference planes associated with the different sets of signal conductors can reduce the isolation between aligned ports and decrease their electrical performance.

While it may be desirable for the signal conductors from one port to be spaced and remain relatively isolated from the reference plane(s) of the other port, under some circumstances this may be difficult to achieve. For example, it is sometimes desirable for vias connected to the signal conductors to pass through the reference plane(s) associated with the other set of signal conductors. This is another instance that may reduce the isolation between aligned ports and decrease their performance.

Figure 6:
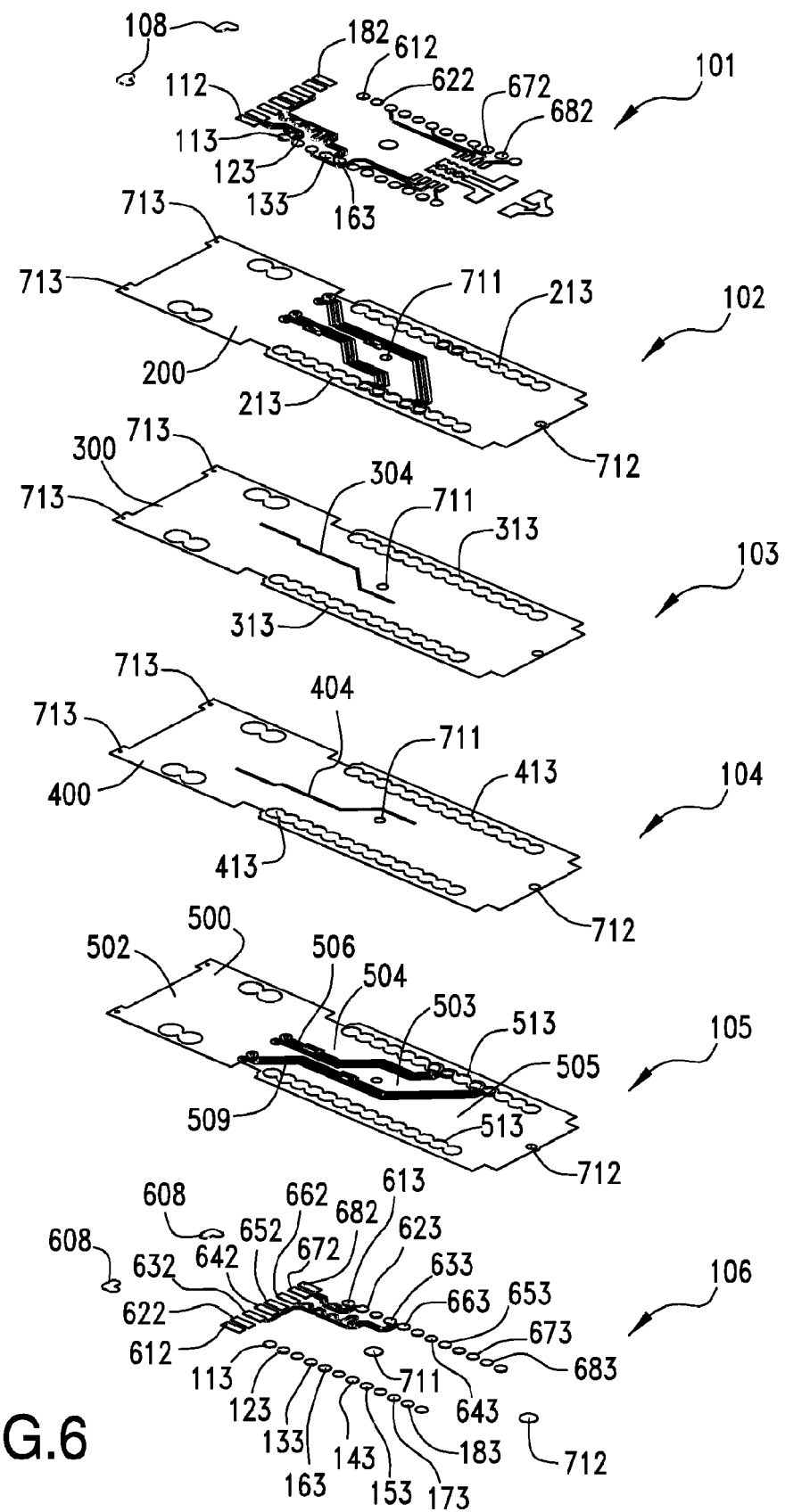
FIG. 6 is an exploded perspective view of the various conductive layers contained within the printed circuit board of FIG. 5.

Referring to FIG. 6, it can be seen that upper circuit board 100 has six conductive layers 101, 102, 103, 104, 105 and 106. Generally, layers 101, 102 and 103 are associated with the upper port and layers 104, 105 and 106 are associated with the lower port. It should be noted that layers 101 and 106 are similar, layers 102 and 105 are similar and layers 103 and 104 are similar so that the upper and lower ports have identical functionality. More specifically, the circuitry of the layers that correspond between the upper and lower ports are "mirror-images" of the other (i.e., are rotated one hundred eighty degrees about the longitudinal axis of "L" circuit board 100). This is necessary due to the circuit designation within the ports whereby the circuit designated number one of the upper port is at the right side of the upper port 33 as viewed in FIG. 1 and the circuit designated number one of the lower port is on the left hand side as viewed in FIG. 1.

It can be seen that inner layers 103 and 104 are identical except that they have been rotated about the longitudinal axis "L" of the circuit board 100 Likewise, layers 102 and 105 are also identical except for their orientation. The conductors of layers 101 and 106 connected to the contact pads that are subsequently connected to the contact assemblies 76, 77 are also identical except for their orientation. However, layer 101 has additional circuitry that is absent from layer 106 as such additional circuitry is utilized to connect components on top of the printed circuit board 100 as well as to connect the center-tap connections from the magnetics 1200. The location of this additional circuitry is typically not critical to the high speed performance of the modular jack 30. In other words, the circuitry within circuit board 100 that may significantly impact the performance of the upper and lower ports is essentially identical except for its orientation. Accordingly, the descriptions of duplicate aspects of layers 101-106 are not repeated herein.

In general, layers 101 and 106 include only signal conductors, layers 103 and 104 include only reference or ground conductors and layers 102 and 105 are a mixed layer with both signal and reference conductors. It should be understood that conductive vias are utilized to connect various conductors in different conductive layers and extend through the dielectric layers. In some instances, signal traces extend through some of the reference planes. For clarity, in the first layer 101 of FIGS. 7-17, only the signal conductors or circuits 110-180 associated with pads 112-182 are shown since these are the signal conductors most likely to be effected by energy emanating from the signal conductors associated with the other port. Contact pad 112 of circuit 110 is connected to via 113 by a conductive trace 134. Similarly, contact pad 122 is connected to via 123 by conductive trace 124 as are the rest of the contact pads 132-182 connected to their associated vias 133-183 by their respective conductive traces 134-184.

Each circuit 110-180 includes a contact pad 112-182, a via 113-183 and a conductive trace 114-184 connecting the contact pad to its respective via. Circuits 110 and 120 are generally closely coupled together with their respective contact pads 112 and 122 adjacent to each other, vias 113 and 123 are positioned adjacent to each other and conductive traces 114 and 124 are also adjacent to each other. It should be noted that conductive trace 114 includes a U-shaped section 115 so that conductive traces 114 and 124 are approximately the same length in order to reduce signal skew. Similarly, circuits 140 and 150 are closely coupled together with contact pad 142 adjacent contact pad 152, via 143 adjacent via 153 and conductive trace 144 adjacent conductive trace 154. Conductive trace 144 includes a U-shaped section 145 in order to increase the path length of the trace 144 so that it approximates the path length of conductive trace 154 in order to reduce signal skew between circuits 140 and 150. Likewise, circuits 170 and 180 are closely coupled together with contact pad 172 adjacent contact pad 182, via 173 adjacent via 183 and conductive trace 174 adjacent trace 184. In addition, conductive trace 174 includes U-shaped section 175 in order to reduce signal skew between circuits 170 and 180.

Figure 8:
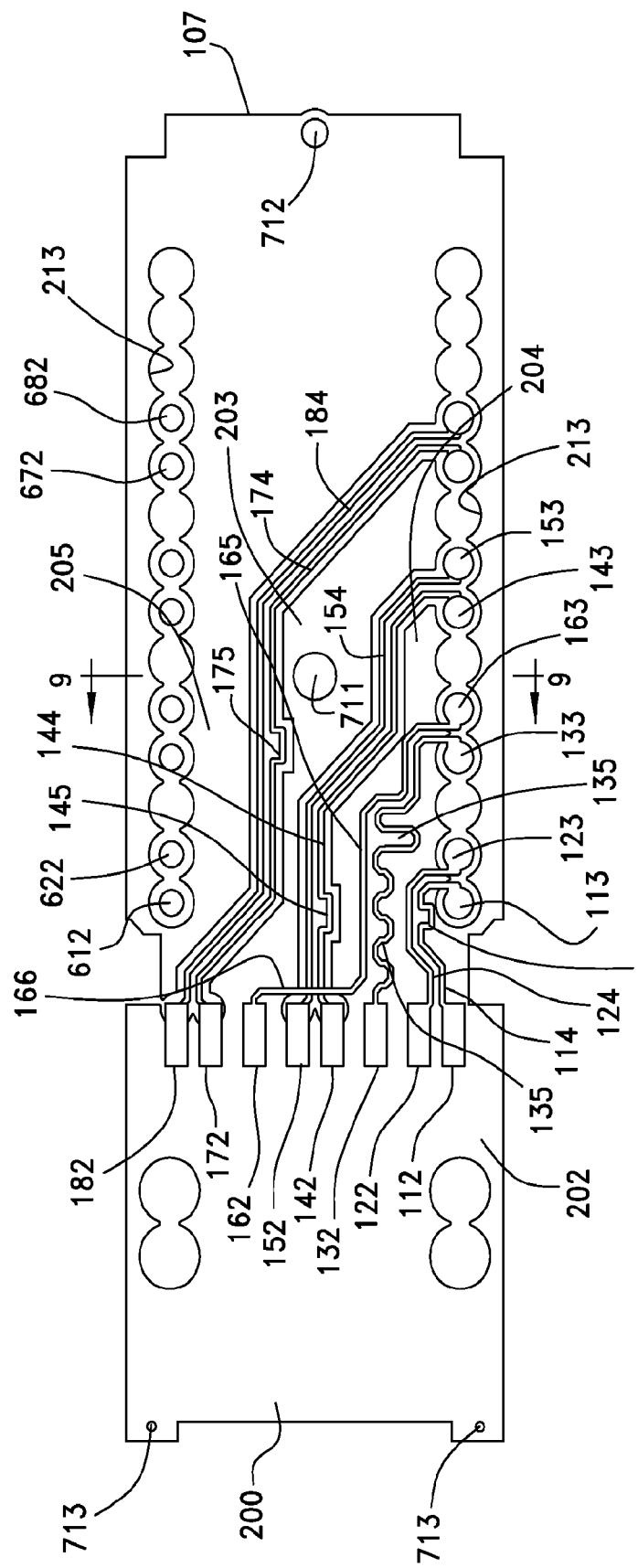
FIG. 8 is a top plan view of the circuit board of FIG. 7.
Figure 9:
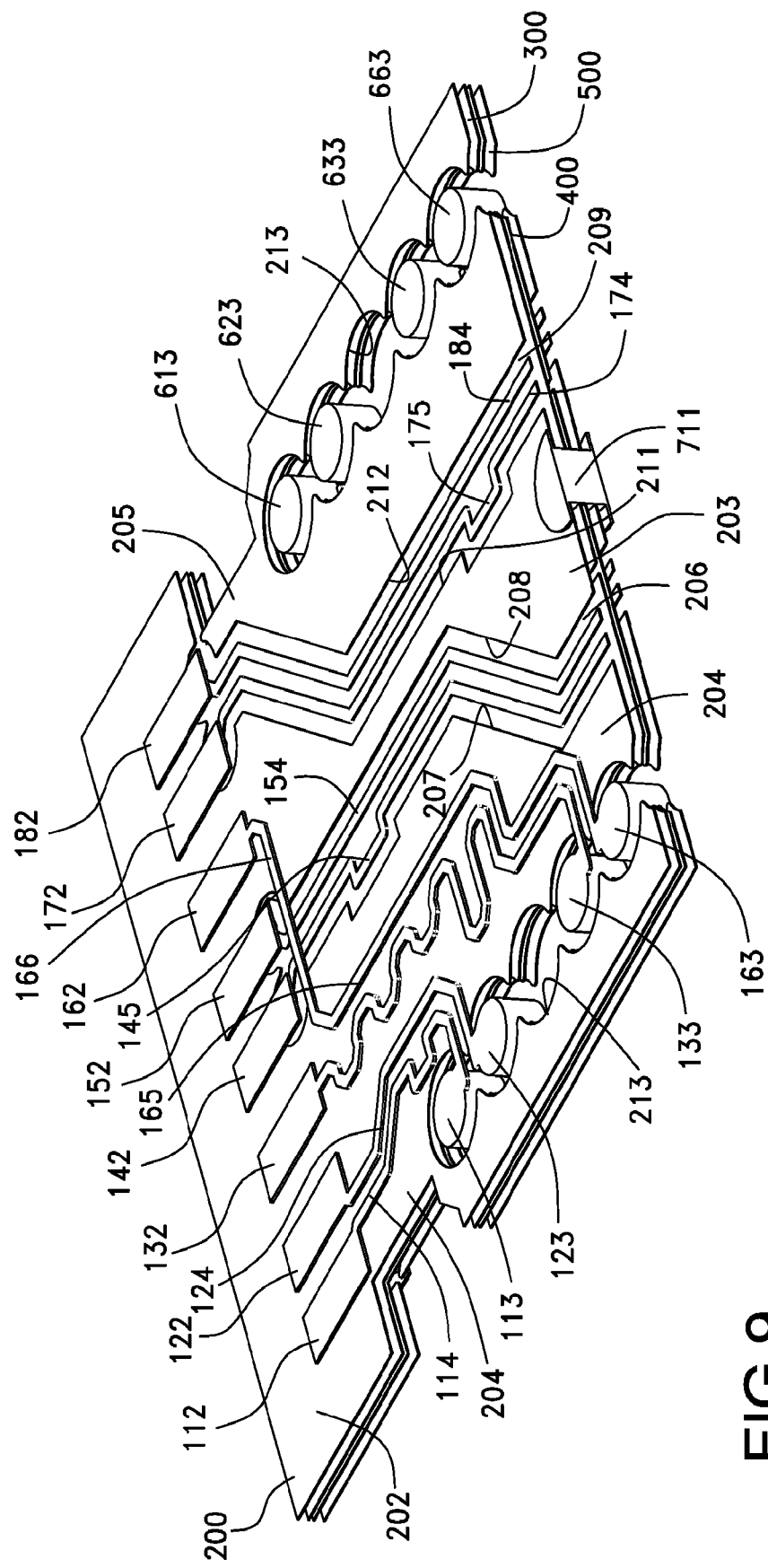
FIG. 9 is a fragmented perspective view of the circuit board of FIG. 8 taken generally along line 9-9 of FIG. 8 and with the front end of the board removed.
Figure 10:
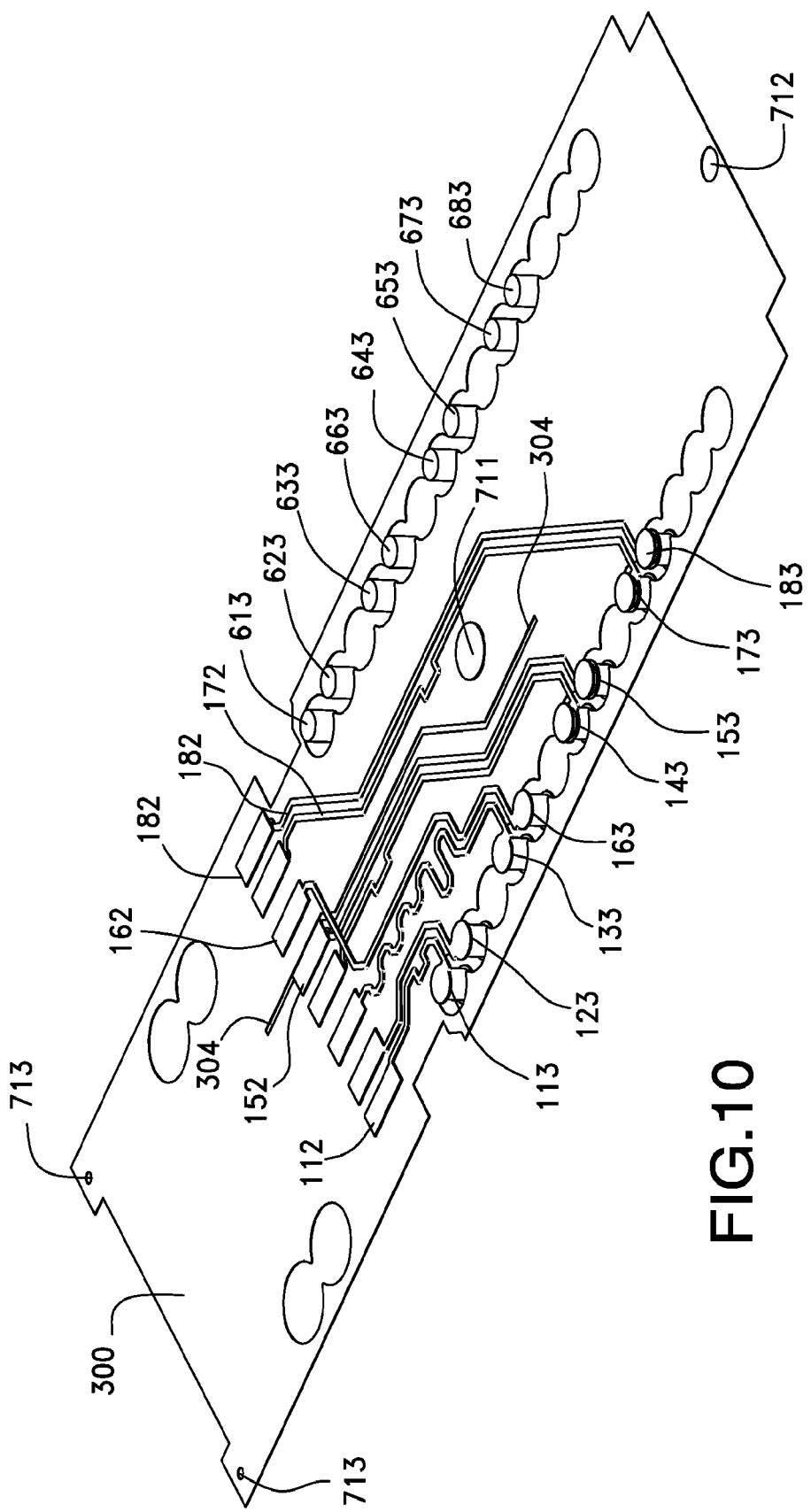
FIG. 10 is a perspective view similar to FIG. 7 but with the upper reference plane removed for clarity.

Circuits 130 and 160 are not as closely coupled together as the other pairs of circuits (namely, circuits 110 and 120, 140 and 150, and 170 and 180). Referring to FIG. 8, contact pad 132 of circuit 130 and contact pad 162 of circuit pad 160 are spaced apart with contact pads 142 and 152 positioned therebetween. Via 133 of circuit 130 is adjacent via 163 of circuit 160 and conductive trace 134 generally extends along a portion 165 of conductive trace 164 of circuit 160. Conductor 160 also includes a length 166 that extends generally perpendicularly to or across conductors 144 and 154 which further reduces the coupling between circuits 130 and 160. Conductive trace 134 includes multiple U-shaped sections 135 in order to reduce signal skew but such multiple U-shaped sections further reduce the coupling between conductors 130 and 160. Accordingly, based upon the geometry of the conductive traces, conductors 130 and 160 are less tightly coupled to each other as compared to the other pairs of conductive traces and thus are more likely to be negatively influenced by alien crosstalk and other undesired energy sources from outside the respective port.

Although the pads 142, 152, 172, 182 of circuits 140, 150, 170, 180 are contained in the first conductive layer 101, the remainder of circuits 140, 150, 170, 180 are contained within the mixed signal and ground layer 102. Thus, the majority of each conductor 140, 150, 170, 180 is contained within layer 102 but such conductors include conductive vias that interconnect an end portion of the circuit traces on layer 102 to the respective conductive pads on layer 101. The majority of layer 102 is a reference plane 200 that, as depicted, can be viewed as being generally divided into four distinct areas or regions. (FIG. 16) A forward reference region 202 is generally located beneath circuit pads 112-182 of layer 101 and extends to the forward end 109 of circuit board 100. A central reference region 203 is generally located between slot or channel 206 in which conductive traces 144, 154 are positioned (FIGS. 8, 11) and slot or channel 209 in which conductive traces 174, 184 are positioned and extends forward to the forward reference region 202. First outer reference region 204 is generally positioned between slot 206 and the longitudinal edge of circuit board 100 adjacent vias 113-183. Second outer reference region 205 is generally located between slot 209 and the opposite longitudinal edge of circuit board 100 adjacent vias 613-683 that are connected to the conductive pads 612-682 on the lower surface of circuit board 100 and further extends to a rear edge 107 of circuit board 100. Although the regions 202-205 of reference plane 200 are general areas designated herein to aid the description and understanding and are not physically distinct areas, the boundary between forward reference region 202 and central reference region is designated by line 214 in FIG. 16 and the boundary between forward reference region 202 and first outer reference region 204 is designated by line 215.

Figure 7:
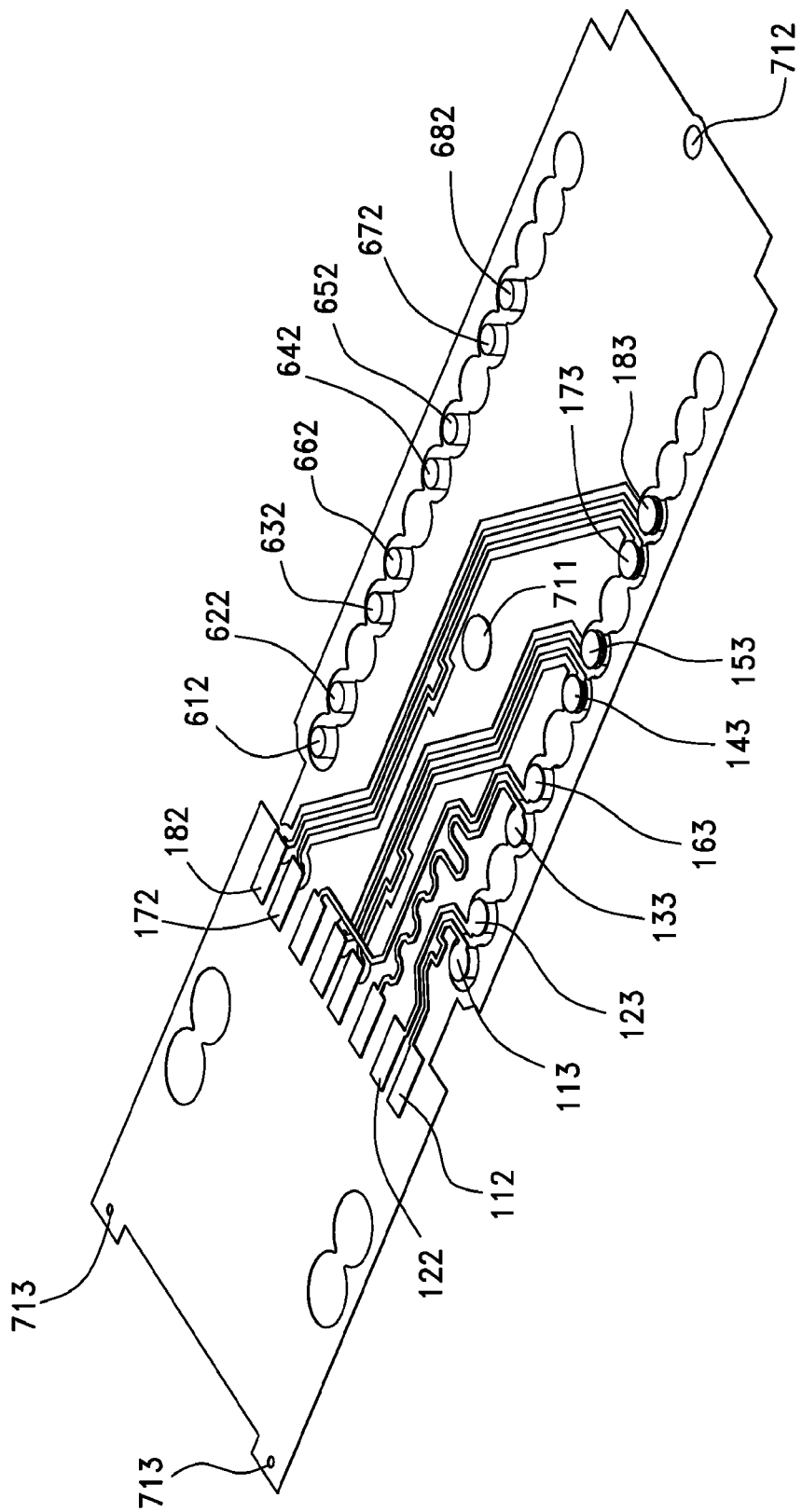
FIG. 7 is a perspective view of the circuit board of FIG. 5 with the dielectric layers and certain conductors removed for clarity.
Figure 11:
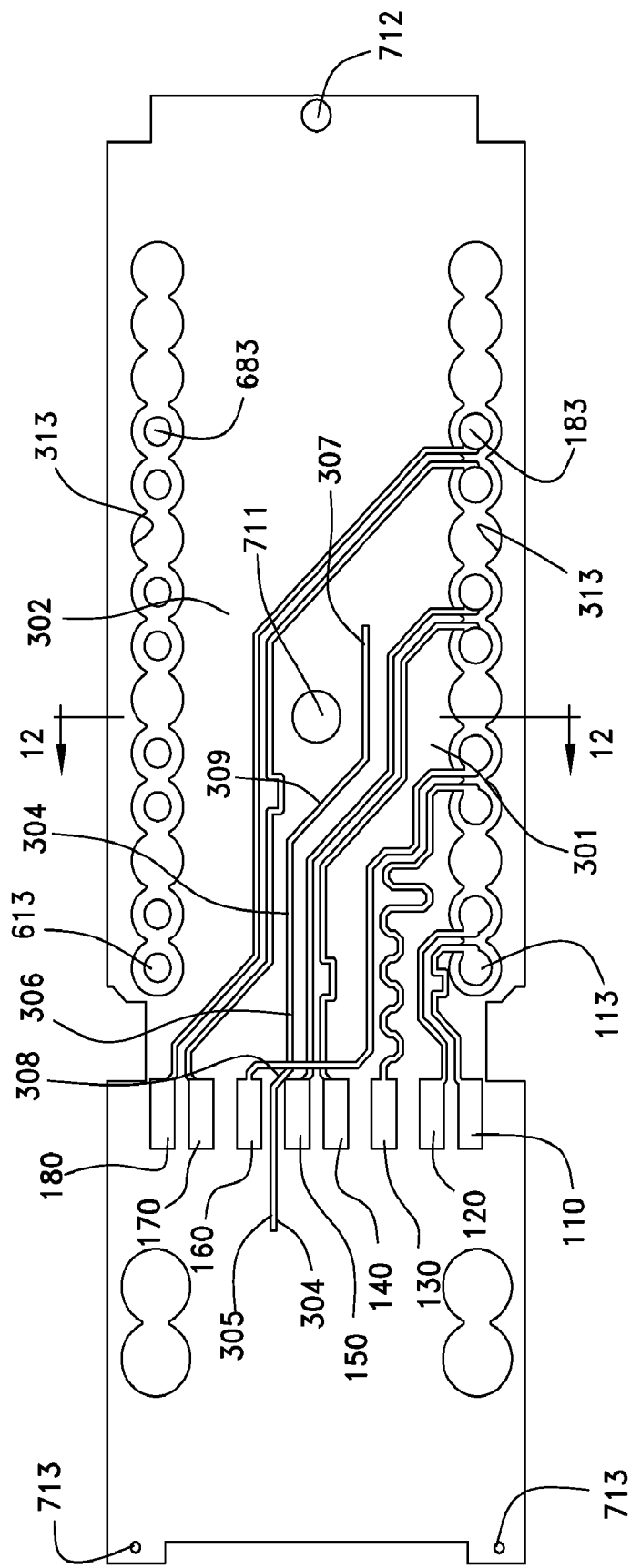
FIG. 11 is a top plan view of the circuit board of FIG. 10.
Figure 12:
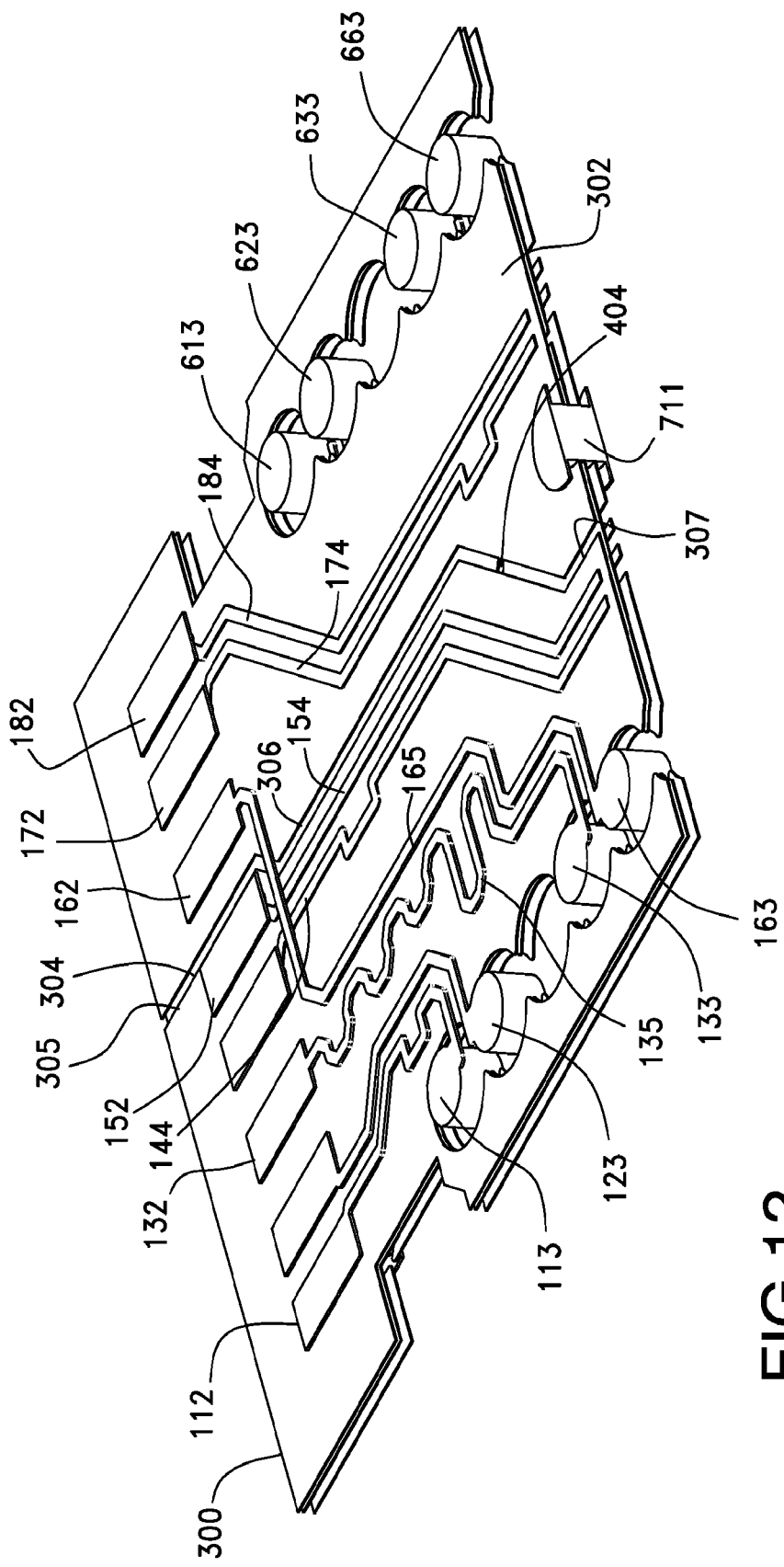
FIG. 12 is a fragmented perspective view of the circuit board of FIG. 11 taken generally along line 12-12 of FIG. 11 and with the front end of the board removed.

Referring to FIGS. 7, 8 and 11, it can be seen that conductive traces 114, 124, 134 and 164 are all in the first conductive layer 101 but are positioned above and closely associated with first outer reference region 204. Conductive traces 144, 154 are located within the second conductive layer 102 and extend within slot 206 between central reference region 203 and first outer reference region 204 defined by the edge 207 of first outer reference region 204 and the edge 208 of central reference region 203. Conductive traces 174, 184 are located within the second conductive layer 102 and extend within slot 209 between central reference region 203 and second outer reference region 205 defined by edge 211 of central reference region 203 and edge 212 of second outer reference region 205. An elongated slot or channel 213 having scalloped elongated inner surfaces is provided along each longitudinal outer edge of circuit board 100 and extends generally from rear end 107 of circuit board 100 towards circuit pads 112-182 and is dimensioned to permit vias 113-183 and 613-683 to extend through the second layer 102 without contacting any portion of the reference plane 200 of the second layer 102.

The portion of central conductive via 711 within the second conductive layer 102 is positioned within central reference region 203. The portion of rear via 712 within the second conductive layer 102 is positioned within second outer reference region 205. The portions of forward vias 713 within the second conductive layer 102 are positioned with forward reference region 202.

Figure 17:
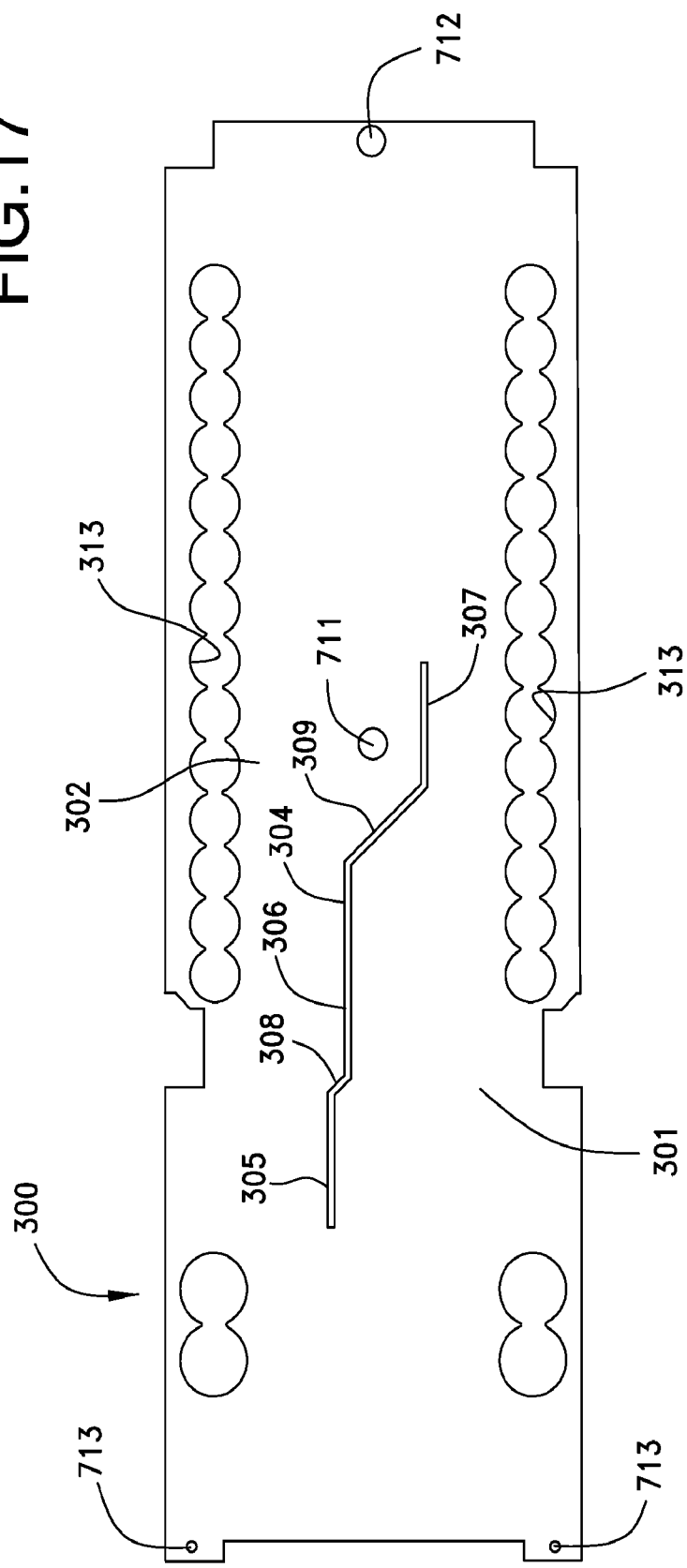
FIG. 17 is a top plan view of the reference plane of the third conductive layer of the circuit board of FIG. 5.

The third layer 103 is essentially a solid reference or ground plane 300 with various openings therein. Reference plane 300 includes a central slot or channel 304 that extends generally along the longitudinal center of reference plane 300. More specifically, it can been seen that slot 304 is formed of three generally parallel but offset sections 305, 306, 307 that are generally parallel to the longitudinal axis "L" of circuit board 100 with the first section 305 connected to the second section 306 by first angled section 308 and the second section 306 connected to third section 307 by a second angled section 309. As a result, it can be seen that slot 304 generally divides a significant portion of reference plane 300 into separate sections or regions. A first region 301 is located on a first side of slot 304 and has conductive traces 114-154 and a portion 165 of trace 164 positioned above the first region 301 (FIG. 17). A second region 302 is located on an opposite side of slot 304 with conductive traces 174 and 184 positioned thereabove. Reference plane 300 includes elongated slots or channels 313 extending along the longitudinal edges of such layer that are configured and aligned to coincide with the aligned elongated slots 213 within reference plane 200 in order to permit the vias 113-183 and 613-683 to past therethrough without making an electrical connection with reference plane 300. The portion of central conductive via 711 within the third layer 103 is positioned within second region 302.

The fourth conductive layer 104 is identical to the third conductive layer 103 except that it has been rotated one hundred eighty degrees about the longitudinal axis "L" of circuit board 100 relative to third layer 103. More specifically, fourth layer 104 includes a reference plane 400, a central slot 404 formed of first, second and third generally parallel sections together with first and second angled sections connecting three sections. A pair of elongated slots or channels 413 extend along the longitudinal edges of reference plane 400 that are configured to align with slots 213, 313 of layers 102, 103 to permit the passage therethrough of vias associated with the various circuits and other components on the circuit board 100

Fifth conductive layer 105 is identical to second conductive layer 102 except that it is rotated one hundred eighty degrees about the longitudinal axis "L" of circuit board 100 relative to second layer 102. Fifth conductive layer 105 includes a reference plane 500 generally formed of four regions. Namely, forward region 502, central reference region 503, first outer reference section 504 and second outer reference region 505. The reference plane 500 also includes a slot or channel 506 between central reference region 503 and first outer reference region 504 as well as an additional slot or channel 509 between central reference region 503 and second outer reference region 505. A pair of conductive traces are located in the slot 506 in the fifth layer 105 between central reference region 503 and first outer reference region 504 and are identical to, but the mirror image, of conductive traces 144, 154 of the second conductive layer 102. Similarly, conductive traces are located within second conductive layer 105 in the slot 509 between the central reference section 503 and the second outer reference region 505 and correspond in shape to conductive traces 174, 184 of the second conductive layer 102 but are the mirror image thereof. Fifth conductive layer 105 also includes elongated slots or channels 513 along its longitudinal edges that are configured to align with slots 213, 313, 414 of layers 102, 103, 104 to permit the passage therethrough of vias associated with the various circuits and other components on the circuit board 100.

Sixth conductive layer 106 is similar to first conductive layer 101 in that it includes a plurality of contact pads and conductive circuits corresponding to circuits 110, 120 130 and 160 of first layer 101. Each of the contact pads is connected by a circuit trace either within the fifth conductive layer 105 or sixth conductive layer 106 to conductive vias 613-683.

When the conductive layers 101-106 are viewed together, the circuit board 100 is formed of essentially identical top and bottom halves (except for certain circuit components and traces associated therewith that are located on the first conductive layer 101 because of its proximity to the top of internal subassembly module 70). Other than their orientation, circuits 110-180 are configured identically to corresponding circuits on the sixth conductive layer 106, conductive layer 102 is identical to conductive layer 105 and conductive layer 103 is identical to conductive layer 104 so that the upper and lower circuitry as well as the connectors attached thereto will perform in an identical manner.

Conductive vias 113-183 and 613-683 extend through the scalloped elongated slots adjacent the longitudinal edges of the circuit board 100 and form an electrical connection with conductive pins 93 that extend upward from component housing 72. (FIG. 4) The various reference layers or planes are electrically connected by a central conductive via 711 which extends through all of the layers of circuit board 100 and is soldered to solder leg 1904 of elongated shield member 1900. A rear via 712 also extends through each layer of circuit board 100 to interconnect the reference planes and is soldered to a second leg 1905 that extends upwardly from elongated shield member 1900. L-shaped conductive pads 108, 608 are located in the first conductive layer 101 and the sixth conductive layer 106, respectively, in each corner adjacent front edge 109 of circuit board 100. Forward vias 713 extend through each layer of circuit board 100 to interconnect the reference planes 200, 300, 400, 500 with pads 108, 608. As a result of vias 711, 712 and 713, the reference planes are commoned or connected together in multiple, spaced apart locations.

The reference planes serve as shields relative to EMI but also serve as return paths for the various signal conductors. Accordingly, energy associated with the lower port (and thus the signal conductors of layers 105 and 106) may travel from reference planes 400, 500 through vias 711, 712 and 713 and into reference planes 200, 300 which may impact signals traveling though the signal conductors of conductive layers 101, 102. In other words, because reference planes 400, 500 act as return paths for the signal conductors of layers 105 and 106, and reference planes 400, 500 are electrically connected to reference planes 200, 300, signals traveling along layers 105, 106 may impact signals traveling along conductive layers 101, 102.

Figure 13:
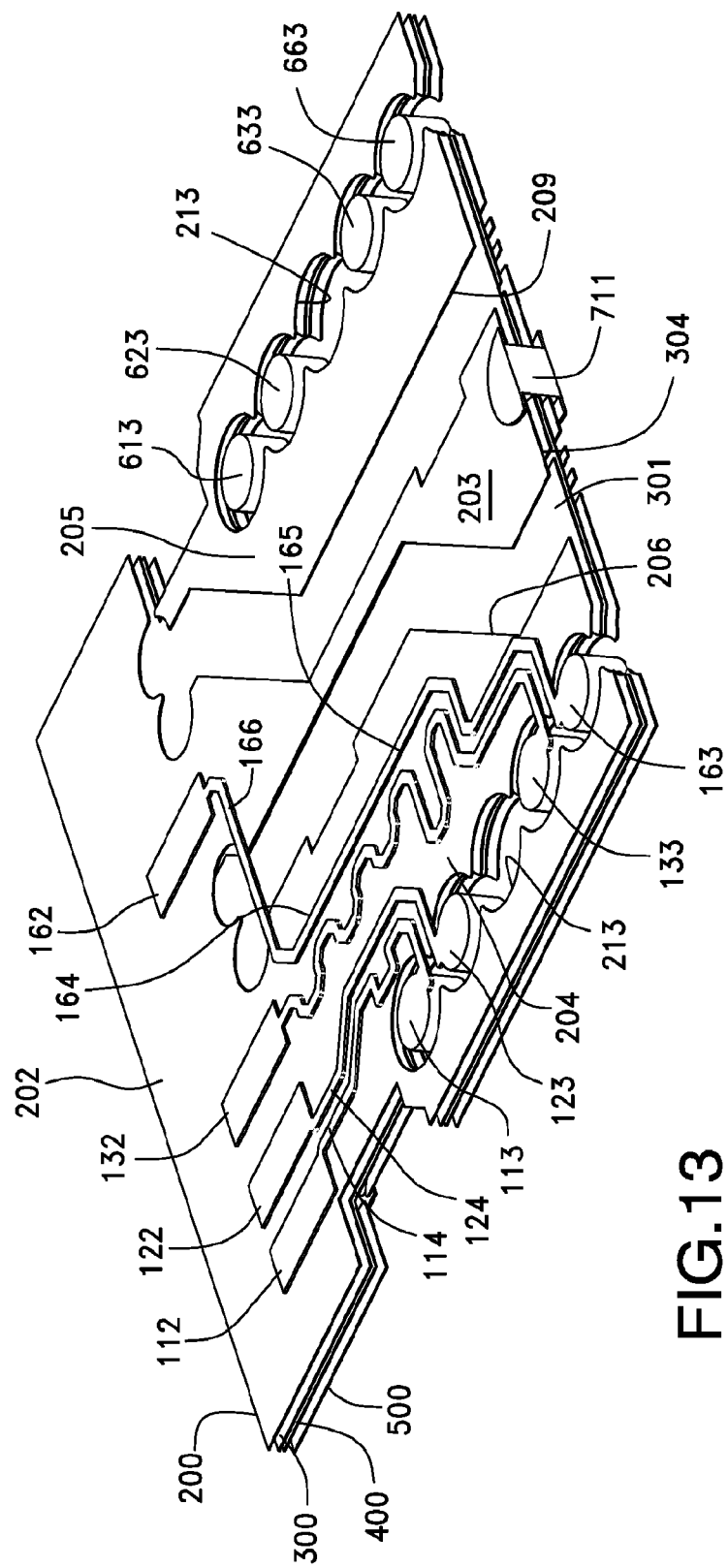
FIG. 13 is a fragmented perspective view similar to FIG. 9 but with the signal traces of the second conductive layer removed for clarity.

Referring to FIG. 13, the conductive layers of circuit board 100 are shown with circuits 140, 150, 170, 180 removed for clarity. More specifically, contact pads 142, 152, 172, 182 of layer 101 and their associated circuit traces 144, 154, 174, 184 of layer 102 as well as the via between first layer 101 and second layer 102 inter-connecting such components have been removed for clarity. It can be seen that the conductors 110, 120 that form the first differential signal pair extend across and closely couple to the first outer reference section 204 of reference section 200 of layer 102. Similarly, it can be seen that the entire length of circuit 130 also is positioned over first outer reference section 204 but only a portion 165 of circuit 160 extends along first outer reference section 204. Contact pad 162 is located at the transition between forward reference section 202 and central reference section 203. In addition, circuit trace section 166 of circuit 160 extends across slot 206 and thus is coupled to a portion of central reference section 203, first outer reference section 204 and a portion of reference plane 300 of third conductive layer 103.

Figure 14:
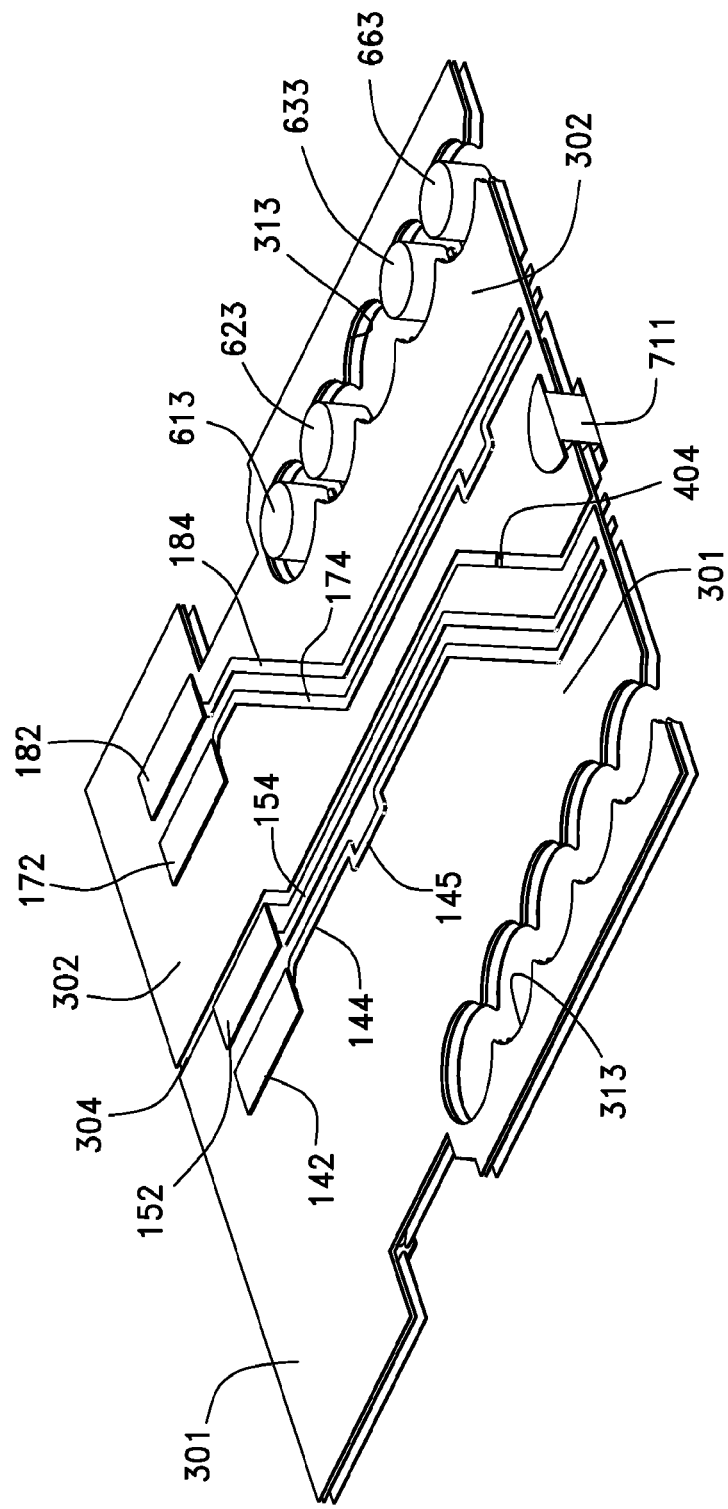
FIG. 14 is a fragmented perspective view similar to FIG. 13 but with the first layer of signal traces and the reference conductor of the second conductive layer removed for clarity.
Figure 15:
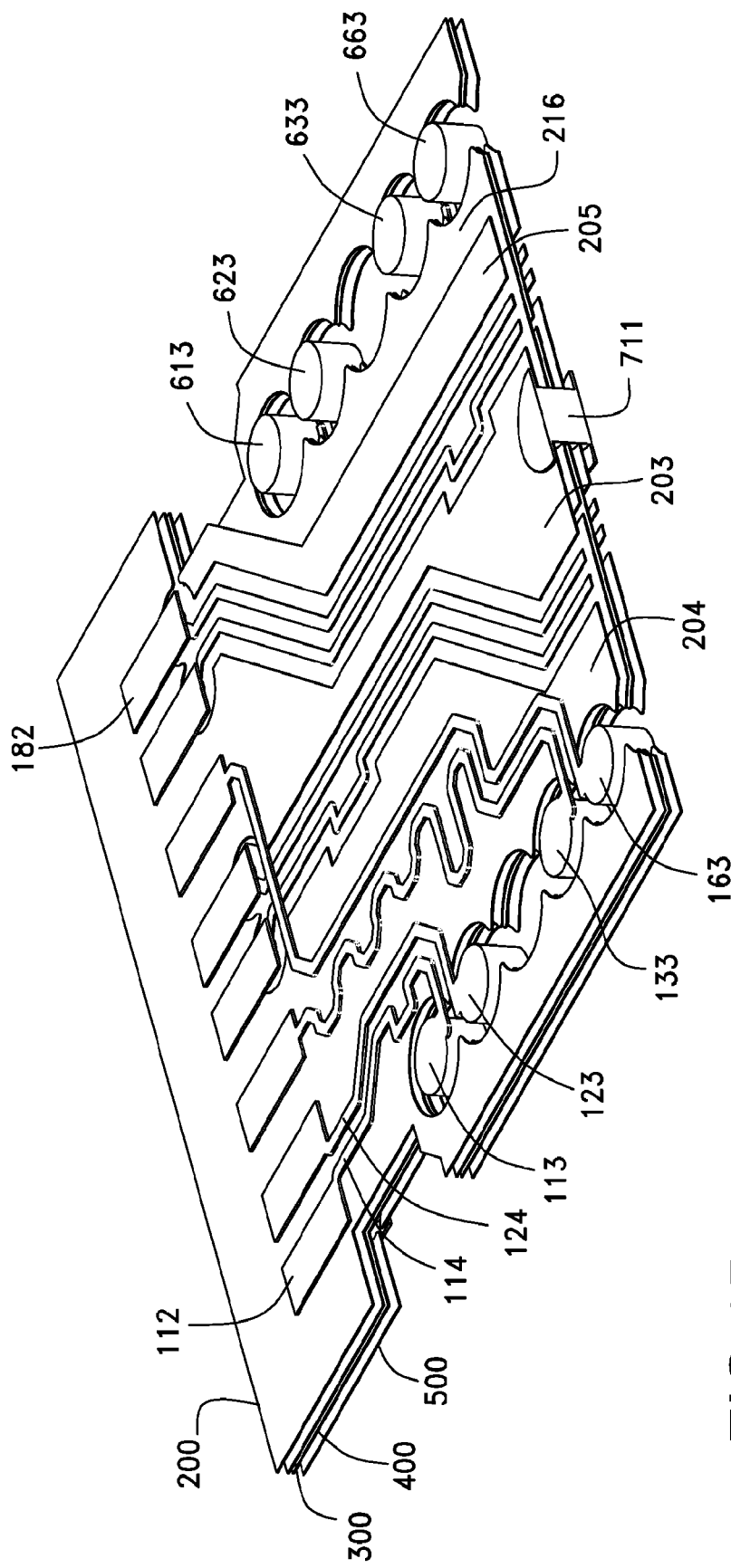
FIG. 15 is a fragmented perspective view of the circuit board similar to FIG. 9 depicting an alternate embodiment of the reference plane.
Figure 16:
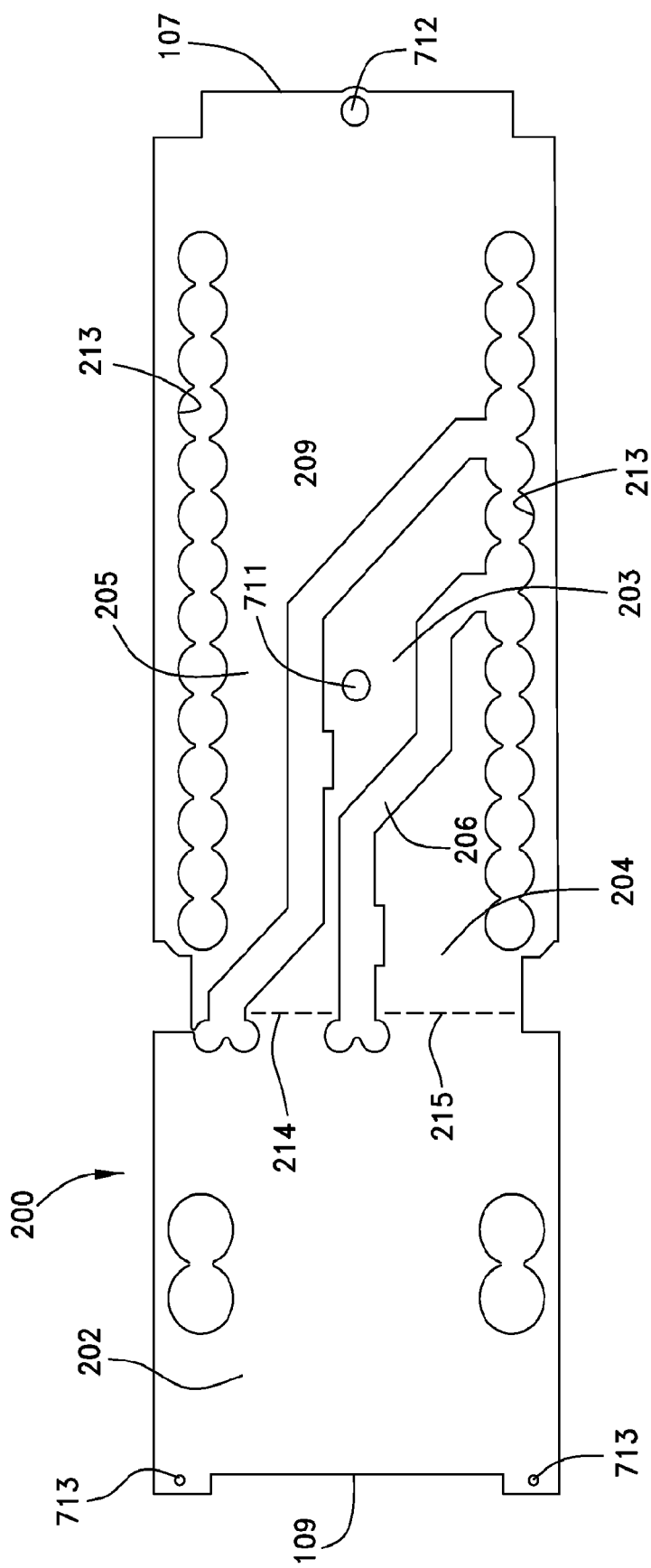
FIG. 16 is a top plan view of the reference plane of the second conductive layer of the circuit board of FIG. 5.

FIG. 14 depicts a section of circuit board 100 with the first conductive layer 101 removed and the reference plane 200 of second conductive layer 102 also removed for clarity. As a result, it can be seen that conductive circuits 140, 150, 170, 180 extend along and are coupled to reference plane 300 of third circuit layer 103. In particular, it can be seen that circuit pads 142, 152 and conductive traces 144, 154 are positioned above a first section 301 of reference plane 300 separated from central via 711 by elongated slot 304.

Elongated slot 304 acts as a circuit interruption within the reference plane to increase the path length between first and second regions 301, 302 of reference plane 300. This is achieved by providing an area of increased impedance or reduced electrical conductivity between first and second regions 301, 302 of reference plane 300 that forces the currents within reference plane 300 to travel around the slot 304. As a result, energy or alien crosstalk from the lower port traveling from reference planes 400, 500 and into reference plane 300 through via 711 is electrically separated from a direct connection to first region 301 by slot 304 so that such energy must travel a greater distance on reference plane 300 before reaching region 301 and thus has less of an impact on circuits 140, 150 than if slot 304 were not present. The longer electrical path between via 711 and region 301 results in additional dissipation of energy that has been transferred from reference planes 400, 500 to reference plane 300 and thus will increase the isolation of the vertically aligned ports and improve their electrical performance. Regions 301 and 302 remain electrically connected so that the loop inductance of circuits 140, 150 is not increased to the point of negating the benefit of slot 304. Since reference plane 300 forms a part of the circuits associated with traces 140, 150, significantly increasing the length of the return paths through plane 300 can reduce the performance of the circuits. Thus, an appropriate balance of return path length with the amount of circuit interruption created by slot 304 is desirable.

In some instances, it may be desirable for the slot 304 to have a length equal to or longer than the signal traces. For example, slot 304 is generally equal to or longer than signal traces 110, 120, 130, 140, 150 and 160. However, it is also possible for the slot 304 to be shorter than the signal traces (e.g., traces 170, 180) yet still provide a desired increase in return path length along the reference plane. The specific length of the slot as compared to the length of the signal traces and the effectiveness of the slot depends on the size and location of the energy source providing energy or current to the reference plane (e.g., via 711) as well as the sensitivity of the signal traces to cross-talk or noise from the energy source. While slot 304 is depicted as being approximately the same length as signal trace 150, it is believed that slot 304 could be substantially shorter in length (e.g., fifty percent or less of the length of the circuit trace 150) yet still provide a realizable benefit. For example, reducing the length of slot 304 so as to only include sections 307 and 309 would still substantially increase the return path length and isolate region 301 from via 711. With such structure, the electrical isolation of an energy source associated with one region of the reference plane 300 relative to another region is effectively increased. If the energy source is a relatively localized area such as, for example, a via, it may be possible to utilize a relatively short slot to increase the electrical isolation. If the energy source is an elongated area such as a signal trace or a series of vias, it would likely be desirable to increase the length of the slot but a relatively short slot may still be effective to shield or isolate components or circuitry and, in particular, portions that may be especially sensitive to cross-talk and other types of noise. In the embodiment described below with respect to FIGS. 18-20, slots 831-834 are utilized to increase the electrical isolation of the electrical pads which can be desirable in some situations due to the increased surface area and resultant increased coupling between the contact pads and the reference plane.

Referring to FIG. 13, first outer reference region 204 is separated from conductive via 711 by slot 206 within second conductive layer 102. Slots 206, 304 thus provide an interruption in the respective reference planes in order to minimize the impact that energy from the other port traveling through via 711 has on the signal conductors of the first port. The vias 613-683 associated with the circuits 610-680 of the lower port extend through reference plane 200 of layer 102 and reference plane 300 of circuit layer 103 (FIG. 11). As a result, energy from the lower port circuits 610-680 may be transferred to reference planes 200, 300 which could negatively impact the performance of the circuits 110-180 of the upper port. However, slot 209, which is located between central reference region 203 and second outer reference region 205 of the second layer 102, will act as a circuit interruption and thus isolate the portion of reference plane 200 associated with circuits 110, 120, 130, 160. Similarly, slot 304 will interrupt energy traveling from the signal vias 613-683 along reference plane 300 and separate such energy from the first region 301 of third layer reference plane 300 that is coupled to circuits 140, 150. As a result, it can be seen that the slots 206, 209, 304, 404, 506, 509 provide a conductivity interruption which reduces the amount of energy transmitted from the signal conductors of one port to the signal conductors of the other port and thus increases the port-to-port isolation which increases the performance of the modular jack. It should be noted that the slots 206, 209, 304, 404, 506, 509 extend a length sufficient to cause the undesired energy to travel a greater distance on the reference plane without extending the slots so far that they create an undesired increase in loop inductance within the circuitry of circuit board 100.

If desired, the plating of second outer reference region 205 could be removed (or never applied) adjacent the signal vias 613-683 to create an additional slot 216 between vias 613-683 and reference region 205 which would reduce the impact of vias 613-683 extending through reference plane 200 as shown in FIG. 17. Similarly, the portion (not shown) of reference plane 300 immediately below the unplated slot 216 adjacent second outer reference region 205 could also be unplated or have reduced conductivity to isolate reference plane 300 from vias 613-683 that extend through such layer.

Figure 18:
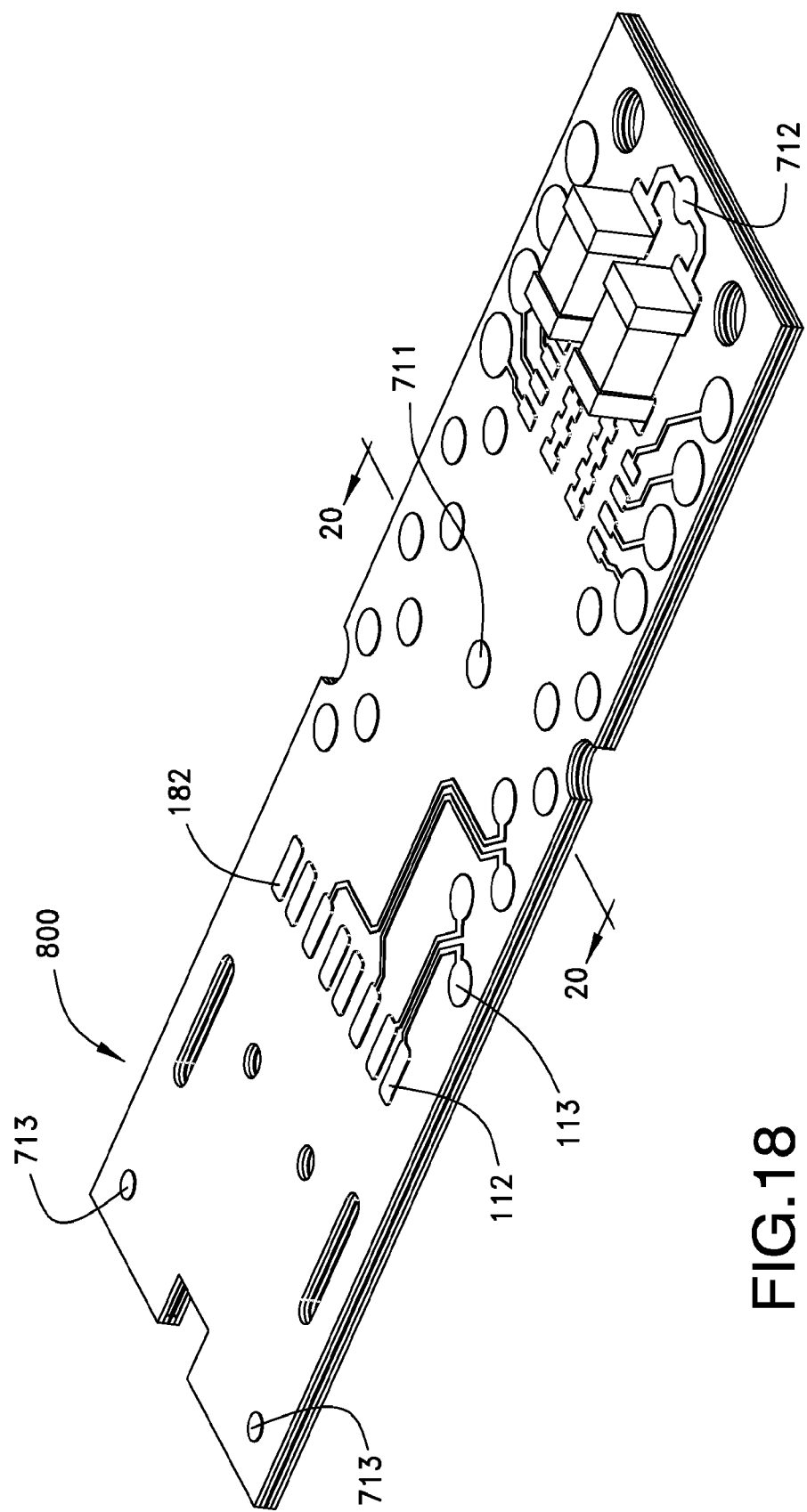
FIG. 18 is a perspective view of an alternate embodiment of a circuit board that could be used with the internal subassembly module of FIG. 3.

FIG. 18 depicts an alternate embodiment of a circuit board 800 that can be used with the internal subassembly module 70 of FIG. 3 to increase the electrical isolation of conductors utilizing the same reference plane as a return path. Inasmuch as the structure of circuit board 800 is similar to that of circuit board 100, like components are depicted with like reference numbers and duplicate description thereof is omitted. Circuit board 800 includes six conductive layers 801-806 (FIG. 19) that are similar in configuration to layers 101-106 of circuit board 100. Each signal circuit is similar to its corresponding signal circuit of circuit board 100 except that they use a different configuration for the vias that extend through the circuit board 800. Consequently, portions of layers 802, 805 include openings adjacent their longitudinal edges that are configured so as to be aligned with the vias associated with signal traces of board 800.

Figure 19:
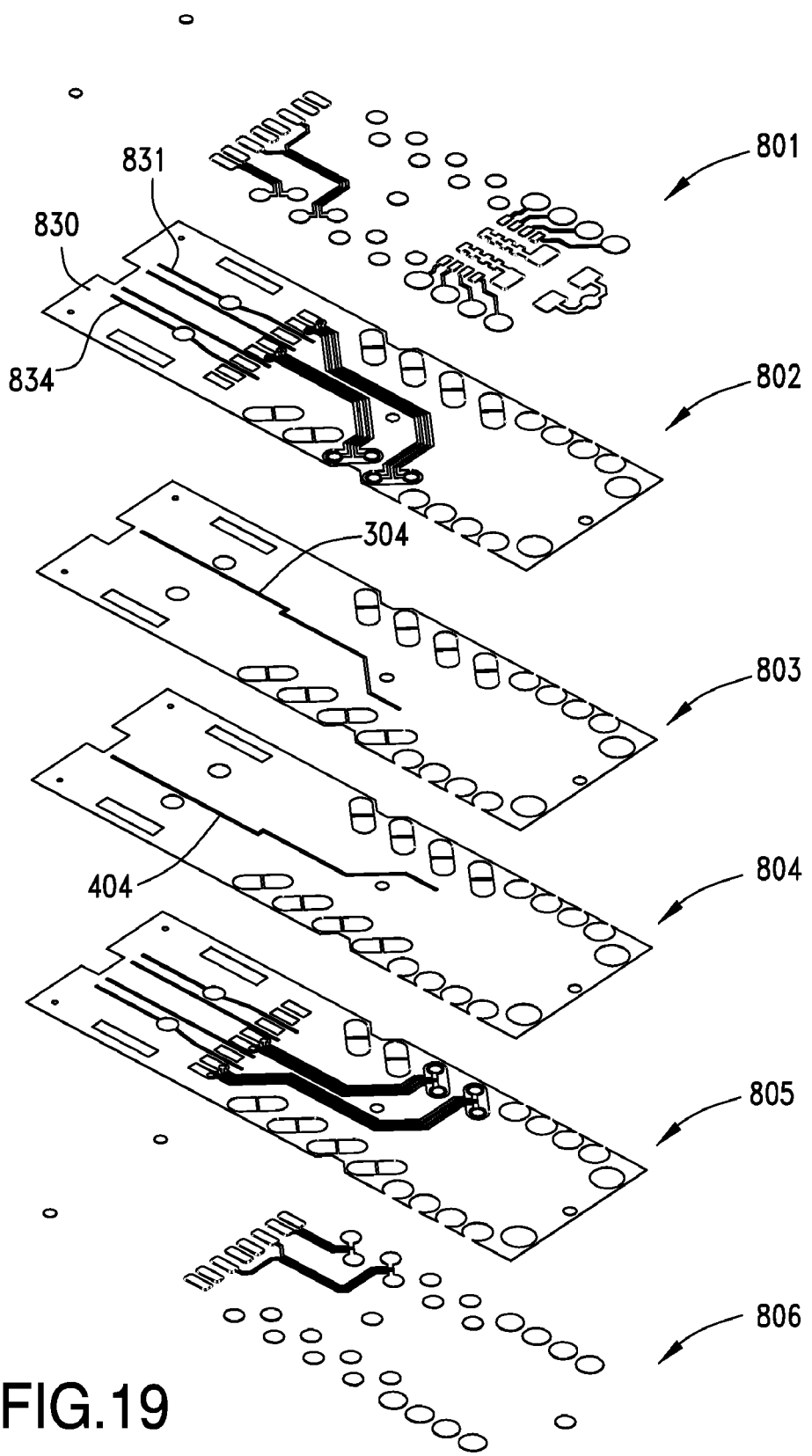
FIG. 19 is an exploded perspective view of the conductive layers of the circuit board of FIG. 18.
Figure 20:
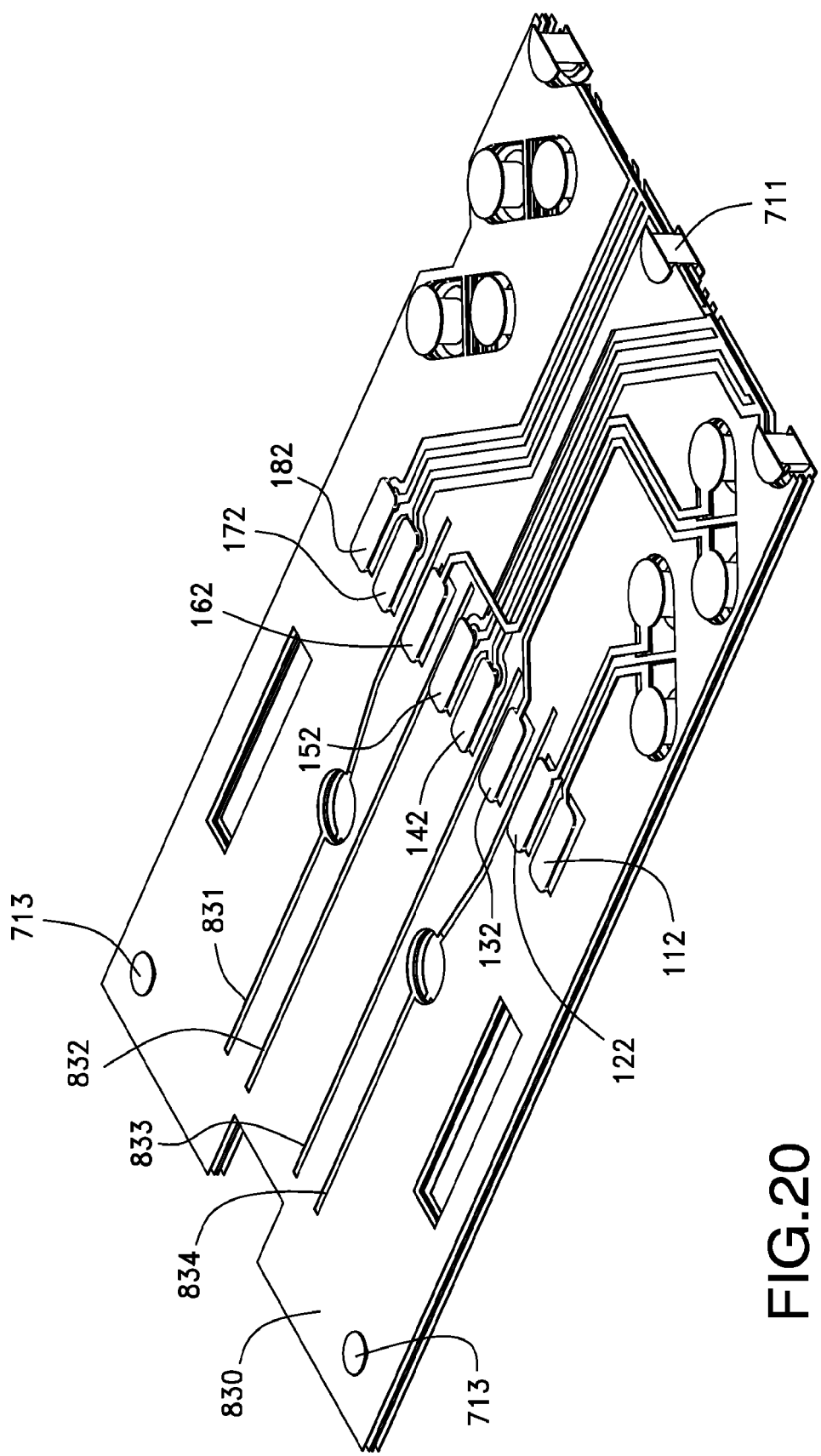
FIG. 20 is a fragmented perspective view of the conductive layers of the circuit board of FIG. 18 taken generally along line 20-20 of FIG. 18.

Referring to FIGS. 19-20, the mixed signal and reference layers 802, 805 of circuit board 800 includes additional slots 831, 832, 833, 834 to provide additional isolation between the contact pads 122, 123, 153, 163, 173 and the reference plane 830 of second conductive layer 802. More specifically, since each of the contact pads 112-182 is located on the first conductive layer 801, each is electrically coupled to the portion of the reference plane 830 immediately below such contact pads on the second conductive layer 802. If a significant amount of energy were traveling through one of the circuits such energy could impact an adjacent circuit since all of the pads use reference plane 830 as part of the return path. The embodiment of FIGS. 18-20 uses slots 832 and 833 positioned on opposite sides of the pair of contact pads 142, 152 to increase the electrically isolation of such circuit pair from contact pads 132, 162 that form another differential pair of circuits. Likewise, slot 831 separates the portion of reference plane 830 associated with contact pads 172, 182 from the section of reference plane 830 associated with contact pad 162. Slot 834 separates the portion of reference plane 830 associated with contact pads 112, 122 with the portion of reference plane 830 associated with contact pad 132. Each of these slots 831-834 serve to increase the electrical isolation of the contact pads and thus improve the electrical performance within the circuitry of circuit board 800.

While the slots of boards 100, 800 are depicted as having a series of straight and angled sections, the shape of the slots is configured in the embodiments depicted based upon the paths of the signal conductors. Slots of other shapes, dimensions and aspect ratios could be utilized. In addition, while the slot is depicted as being devoid of conductive material to act as a circuit interruption within the reference plane to increase the path length between regions of a reference plane, other structures and components could also be used for that purpose. For example, in some circumstances it may be possible to use an area having a cross-hatched or roughened surface to reduce the conductivity and create an area of increased impedance or reduced electrical conductivity. Still further, it may be possible to bridge the slots with circuit components such as inductors or capacitors to control the communication path across the slot based upon the frequency at which the system or signals operate. By utilizing appropriate inductors across the slot, frequencies above a predetermined value would be forced around the slot and along the increased path length while lower frequencies would pass across the slot through the inductors.

Referring to FIG. 21, a somewhat schematic cross-sectional depiction of circuit board 100 is shown with certain aspects removed for clarity. More specifically, only conductive traces 124 and 134 of conductive layer 101 are depicted. Layer 102 includes reference plane 200 with slot 206 having conductive traces 144, 154 positioned therein and slot 209 having conductive traces 174, 184 positioned therein. Layers 103 and 104 include reference planes 300 and 400, respectively. Layer 105 includes reference plane 500 with slot 506 having conductive traces 644, 654 positioned therein and slot 509 having conductive traces 614, 624 positioned therein. Only conductive traces 674, 684 of conductive layer 106 are depicted. Conductive via 711 interconnects reference planes 200-500. The conductive vias 163 and 663 are shown extending through but spaced from reference planes 200-500 along the opposite edges of the circuit board 100.

FIG. 22 depicts a somewhat schematic cross-section similar to FIG. 21 but with only certain aspects depicted and other aspects modified in order to illustrate a first manner by which the structure of circuit board 100 improves the electrical performance therein. More specifically, with respect to conductive layer 102, only the conductive traces 144 and 154 are shown. With respect to conductive layer 103, conductive reference plane 300 with slot 304 is shown but without the scalloped slots 313 on both ends of the reference plane. Conductive layer 104 includes a portion of conductive reference plane 400 but with slot 404 and the scalloped slots 513 removed. Conductive via 711 mechanically and electrically interconnects reference planes 300 and 400. In operation, to the extent that an energy source "E" is adjacent reference plane 400, current may pass along reference plane 400 at 400a, through via 711 at 711a and along reference plane 300 at 300a. However, further movement along reference plane 300 directly towards conductive signal traces 144, 154 is prevented due to slot 304 in the reference plane 300. The current or energy on reference plane 300 will need to travel a longer route around 304 (i.e., which increases the path length) to reach the portion of reference plane 300 directly adjacent signal traces 144, 154. As described above, the longer path length will decrease the amount of energy on the reference plane 300 adjacent signal traces 144, 154 and thus the energy source "E" will have less of an impact on the signal traces. Energy source "E" may take a variety of forms such as signal traces, integrated circuits or any other element or component that may couple with or impart energy to the adjacent reference plane 400.

Figure 23:
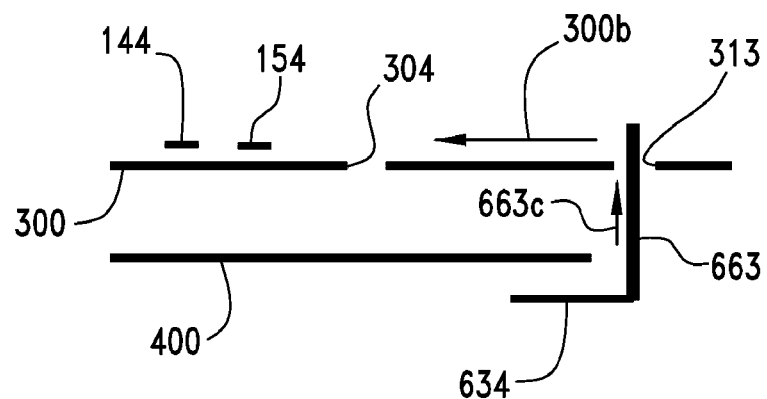
FIG. 23 is a generally schematic cross-sectional view illustrating another aspect of the circuit board of FIG. 5.

FIG. 23 depicts a second manner by which the structure of circuit board 100 improves electrical performance and is similar to the schematic cross-section of FIG. 22 with respect to layers 102-104 but does not include via 711. In addition, energy source "E" is replaced with a signal trace, for example 634, that is mechanically and electrically connected to a conductive via, for example 663. The via 663 may extend past or through an end of reference plane 400 and to or past reference plane 300. When a signal is present on signal trace 634, a portion of the signal will also pass along via 663 at 663a. Some of the energy on via 663 will couple to reference plane 300 and travel along the reference plane 300 at 300b. However, further movement along reference plane 300 directly towards conductive signal traces 144, 154 is prevented due to slot 304 in the reference plane 300. The current or energy on reference plane 300 will need to travel a longer route around slot 304 (i.e., which increases the path length) to reach the portion of reference plane 300 directly adjacent signal traces 144, 154. The longer path length will decrease the amount of energy on the reference plane 300 adjacent signal traces 144, 154 and thus the signal trace 634 and via 663 will have less of an impact on the signal traces 144, 154.

Figure 24:
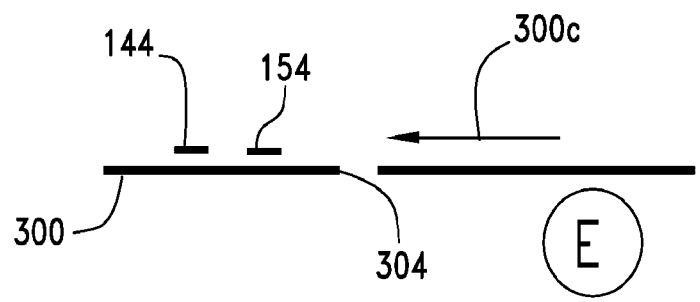
FIG. 24 is a generally schematic cross-sectional view illustrating still another aspect of the circuit board of FIG. 5.

FIG. 24 depicts a somewhat schematic cross-section similar to FIG. 21 with only certain aspects depicted and other aspects modified in order to illustrate a third manner by which the structure of circuit board 100 improves the electrical performance therein. More specifically, only the conductive traces 144 and 154 of conductive layer 102 and conductive reference plane 300 are shown. To the extent that an energy source "E" is adjacent reference plane 300, current may pass along reference plane 300 at 300c. However, further movement along reference plane 300 directly towards conductive signal traces 144, 154 is prevented due to slot 304 in the reference plane 300. The current or energy on reference plane 300 will need to travel a longer route around 304 (i.e., which increases the path length) to reach the portion of reference plane 300 directly adjacent signal traces 144, 154. The longer path length will decrease the amount of energy on the reference plane 300 adjacent signal traces 144, 154 and thus the energy source "E" will have less of an impact on the signal traces.

Although the disclosure provided has been described in terms of illustrated embodiments, it is to be understood that the disclosure is not to be interpreted as limiting. Various alterations and modifications will no doubt become apparent to those skilled in the art after having read the above disclosure. Accordingly, numerous other embodiments, modifications and variations within the scope and spirit of the appended claims will occur to persons of ordinary skill in the art from a review of this disclosure.

The invention claimed is:

1. A multi-layer circuit member comprising:
   first and second spaced apart, generally parallel conductive reference planes;
   an electrically conductive via extending between the first and second reference planes to electrically interconnect the first and second reference planes;
   a first signal conductor adjacent a first region of the first reference plane;
   at least one component adjacent to and operative to transfer energy to the second reference plane; and
   an elongated area of increased impedance in the first reference plane located between the first region of the first reference plane and the via, wherein the elongated area of increased impedance is an elongated slot in the first reference plane, the elongated slot having two opposing sides and two ends, wherein the two sides of the elongated slot are not in direct electrical communication except at the ends of the elongated slot or through the via.

2. The multi-layer circuit member of claim 1, wherein the first signal conductor is one of a plurality of first signal conductors lying in a common plane generally parallel to the first reference plane and at least a portion of the plurality of first signal conductors are adjacent the first region of the first reference plane.

3. The multi-layer circuit member of claim 2, wherein the plurality of first signal conductors are configured to be electrically coupled to the first reference plane.

4. The multi-layer circuit member of claim 2, wherein the plurality of first signal conductors include at least two pairs of preferentially coupled first signal conductors.

5. The multi-layer circuit member of claim 1, further including a plurality of first signal conductors adjacent the first reference plane and positioned on a side of the first reference plane opposite the second reference plane, and a plurality of second signal conductors adjacent the second reference plane and positioned on a side of the second reference plane opposite the first reference plane.

6. The multi-layer circuit member of claim 1, wherein the at least one component is a second signal conductor electrically coupled to the second reference plane.

7. The multi-layer circuit member of claim 1, wherein the first signal conductor has a first length and the elongated slot has a length greater than approximately half of the first length of the first signal conductor.

8. The multi-layer circuit member of claim 1, wherein the first signal conductor has a first length and the elongated slot has a length at least as long as approximately the first length of the first signal conductor.

9. A multi-layer circuit member comprising:
   first and second spaced apart, generally parallel conductive reference planes;
   an electrically conductive via extending between the first and second reference planes to electrically interconnect the first and second reference planes;
   a first signal conductor adjacent a first region of the first reference plane;
   at least one component adjacent to and operative to transfer energy to the second reference plane; and
   an elongated area of increased impedance in the first reference plane located between the first region of the first reference plane and the via, wherein the area of increased impedance is a region with a cross-hatched conductive pattern.

10. A multi-layer circuit member comprising:
    first and second spaced apart, generally parallel conductive reference planes;
    an electrically conductive via extending between the first and second reference planes to electrically interconnect the first and second reference planes;
    a first signal conductor adjacent a first region of the first reference plane;
    at least one component adjacent to and operative to transfer energy to the second reference plane; and
    an elongated area of increased impedance in the first reference plane located between the first region of the first reference plane and the via, wherein the area of increased impedance is a region with a roughened surface.

11. A multi-layer circuit member comprising:
    a conductive reference plane including first and second electrically connected regions;
    at least a portion of a first signal conductor adjacent the first region of the reference plane;
    at least one second signal conductor including a portion extending through an opening in the reference plane adjacent the second region of the reference plane; and
    an area of increased impedance between the first and second electrically connected regions of the reference plane, wherein the area of increased impedance is an elongated slot in the reference plane, the elongated slot having two opposing sides and two ends, wherein the two sides of the elongated slot are not in direct electrical communication except at the ends of the elongated slot or through the via.

12. The multi-layer circuit member of claim 11, further including a second conductive reference plane, the conductive reference plane and the second conductive plane being spaced apart and generally parallel, the at least one second signal conductor including a second portion adjacent the second reference plane.

13. The multi-layer circuit member of claim 11, wherein the first signal conductor is one of a plurality of first signal conductors lying in a common plane generally parallel to the reference plane and at least a portion of the plurality of first signal conductors are adjacent and electrically coupled to the first region of the reference plane.

14. A filtering module comprising:
   a housing formed of a dielectric material;
   a magnetics assembly mounted on the housing including at least one filtering transformer, each filtering transformer being interconnected to a plurality of conductors; and
   a multi-layer circuit member mounted on the housing, the circuit member including first and second spaced apart, generally parallel reference planes, a junction at the first reference plane to electrically interconnect the first and second reference planes, a first signal conductor electrically connected to one of the plurality of conductors of the magnetics assembly, the first signal conductor being adjacent to the first reference plane, a first portion of the first signal conductor being adjacent to a first region of the first reference plane, at least one component operative to transfer energy to the second reference plane, and an elongated slot in the first reference plane located between the first region of the first reference plane and the junction.

15. The filtering module of claim 14, wherein the at least one component is a second signal conductor electrically connected to one of the plurality of conductors of the magnetics assembly and electrically coupled to the second reference plane.

16. The filtering module of claim 14, wherein the filtering transformer includes a plurality of wires wrapped therearound.

* * * * *